(12) United States Patent
Meersman

(10) Patent No.: US 10,210,794 B2
(45) Date of Patent: Feb. 19, 2019

(54) FLEXIBLE DISPLAY TILE AND METHOD OF PRODUCING SAME

(71) Applicant: BARCO N.V., Kortrijk (BE)

(72) Inventor: Karim Meersman, Kortemark (BE)

(73) Assignee: BARCO N.V., Kortrijk (BE)

( * ) Notice: Subject to any disclaimer, the term of this patent is extended or adjusted under 35 U.S.C. 154(b) by 83 days.

(21) Appl. No.: 15/031,546

(22) PCT Filed: Oct. 28, 2014

(86) PCT No.: PCT/EP2014/073162
§ 371 (c)(1),
(2) Date: Apr. 22, 2016

(87) PCT Pub. No.: WO2015/063115
PCT Pub. Date: May 7, 2015

(65) Prior Publication Data
US 2016/0267835 A1 Sep. 15, 2016

(30) Foreign Application Priority Data

Oct. 28, 2013 (GB) .................................. 1318963.4

(51) Int. Cl.
*G09G 3/32* (2016.01)
*G06F 3/14* (2006.01)
(Continued)

(52) U.S. Cl.
CPC ............. *G09G 3/32* (2013.01); *G06F 3/1446* (2013.01); *H05K 5/0021* (2013.01); *H05K 5/0247* (2013.01); *G09G 2300/026* (2013.01); *G09G 2300/0426* (2013.01); *G09G 2330/02* (2013.01); *G09G 2380/02* (2013.01); *H01L 27/3293* (2013.01)

(58) Field of Classification Search
CPC ......... G09G 3/32; H01L 27/3293; F21S 4/22; F21S 4/24
USPC ........................................ 362/249.08, 249.04
See application file for complete search history.

(56) References Cited

U.S. PATENT DOCUMENTS 3,894,225 A * 7/1975 Chao ....................... G09F 13/28
174/117 A
4,173,035 A * 10/1979 Hoyt ....................... F21S 10/00
361/749
(Continued)

FOREIGN PATENT DOCUMENTS

CN 2346025 Y 10/1999
CN 1582461 A 2/2005
(Continued)

OTHER PUBLICATIONS

International Search Report (ISR) dated Jan. 26, 2015, for PCT/EP2014/073162.
(Continued)

*Primary Examiner* — William N Harris
(74) *Attorney, Agent, or Firm* — Bacon & Thomas, PLLC

(57) ABSTRACT

A flexible display tile having a plurality of luminous sources, the flexible display tile provided with a plurality of enclosures that are positioned around one or more of the luminous sources, where the enclosures are filled with a potting material. Additionally, a method of providing a flexible display tile.

15 Claims, 26 Drawing Sheets

(51) Int. Cl.
*H05K 5/00* (2006.01)
*H05K 5/02* (2006.01)
*H01L 27/32* (2006.01)

(56) References Cited

U.S. PATENT DOCUMENTS

| | | | |
|---|---|---|---|
| 5,559,681 A * | 9/1996 | Duarte | F21V 21/08 |
| | | | 362/231 |
| 5,900,850 A | 5/1999 | Bailey et al. | |
| 8,262,250 B2 * | 9/2012 | Li | F21V 17/007 |
| | | | 362/219 |
| 8,434,963 B2 | 5/2013 | Alkas et al. | |
| 8,629,464 B2 * | 1/2014 | Roberts | F21V 29/74 |
| | | | 257/88 |
| 9,640,516 B2 * | 5/2017 | Cope | H01L 25/0753 |
| 2003/0072153 A1 | 4/2003 | Matsui et al. | |
| 2004/0047151 A1 | 3/2004 | Bogner et al. | |
| 2005/0092517 A1 * | 5/2005 | Fan | F21S 4/24 |
| | | | 174/117 FF |
| 2006/0039142 A1 | 2/2006 | Temple | |
| 2007/0218751 A1 | 9/2007 | Ward | |
| 2007/0237284 A1 | 10/2007 | Lys et al. | |
| 2008/0136348 A1 | 6/2008 | Varrin et al. | |
| 2009/0021496 A1 * | 1/2009 | Silzars | G09F 13/22 |
| | | | 345/204 |
| 2009/0021939 A1 * | 1/2009 | Costello | D03D 9/00 |
| | | | 362/249.02 |
| 2009/0322651 A1 | 12/2009 | Tennagels | |
| 2010/0135032 A1 | 6/2010 | Franklin et al. | |
| 2011/0102307 A1 | 5/2011 | Wendler et al. | |
| 2012/0019490 A1 | 1/2012 | Huang | |
| 2012/0162990 A1 * | 6/2012 | Crandell | B32B 33/00 |
| | | | 362/249.04 |
| 2012/0228645 A1 * | 9/2012 | Tu | F21K 9/00 |
| | | | 257/88 |
| 2012/0236509 A1 * | 9/2012 | Cope | G02F 1/133305 |
| | | | 361/730 |
| 2014/0168982 A1 * | 6/2014 | Crandell | B32B 33/00 |
| | | | 362/249.04 |
| 2014/0198505 A1 * | 7/2014 | Yan | G09F 9/33 |
| | | | 362/249.04 |
| 2014/0247595 A1 * | 9/2014 | Lind | G09F 13/0404 |
| | | | 362/249.04 |
| 2014/0331532 A1 * | 11/2014 | Deppiesse | F21S 4/005 |
| | | | 40/541 |
| 2014/0334142 A1 * | 11/2014 | Levante | F21S 4/005 |
| | | | 362/222 |

FOREIGN PATENT DOCUMENTS

| | | |
|---|---|---|
| CN | 1781132 A | 5/2006 |
| CN | 101185175 A | 5/2008 |
| CN | 101185379 A | 5/2008 |
| CN | 101393702 A | 3/2009 |
| CN | 202307013 U | 7/2012 |
| DE | 3633565 A1 | 4/1988 |
| EP | 1437703 A1 | 7/2004 |
| EP | 1650731 A2 | 4/2006 |
| EP | 1716553 A1 | 11/2006 |
| EP | 2023391 A2 | 2/2009 |
| EP | 2110801 A2 | 10/2009 |
| EP | 2459888 A1 | 6/2012 |
| EP | 2515622 A2 | 10/2012 |
| WO | 2004105131 A1 | 12/2004 |
| WO | 2005/091258 A1 | 9/2005 |
| WO | 2008074800 A1 | 6/2008 |
| WO | 2009095867 A2 | 8/2009 |
| WO | 2009096591 A1 | 8/2009 |
| WO | 2011/012286 A1 | 2/2011 |
| WO | 2018074800 A1 | 4/2018 |

OTHER PUBLICATIONS

Written Opinion dated Jan. 26, 2015, for PCT/EP2014/073162.
International Preliminary Report on Patentability (IPRP) dated Feb. 5, 2016, for PCT/EP2014/073162.
Second Written Opinion dated Sep. 30, 2015, for PCT/EP2014/073162.
Notification of Informal Communication dated Jan. 28, 2016, for PCT/EP2014/073162.
British Search Report dated Apr. 17, 2014, for GB 1318963.4.
EPO correspondence in corresponding European application EP 14799360.4-1903 dated Nov. 30, 2017.
EPO correspondence in corresponding European application EP 14799118.6-1903 dated Nov. 30, 2017.
European Office Action in related Application No. 14799118.6-1209, dated Oct. 15, 2018.
European Office Action in related Application No. 14799360A-1209, dated Oct. 15, 2018.
Chinese Office Action in related Application No. 201480070129.8, dated Jun. 12, 2018.
Chinese Office Action in related Application No. 201480059492X, dated Feb. 7, 2018.

* cited by examiner

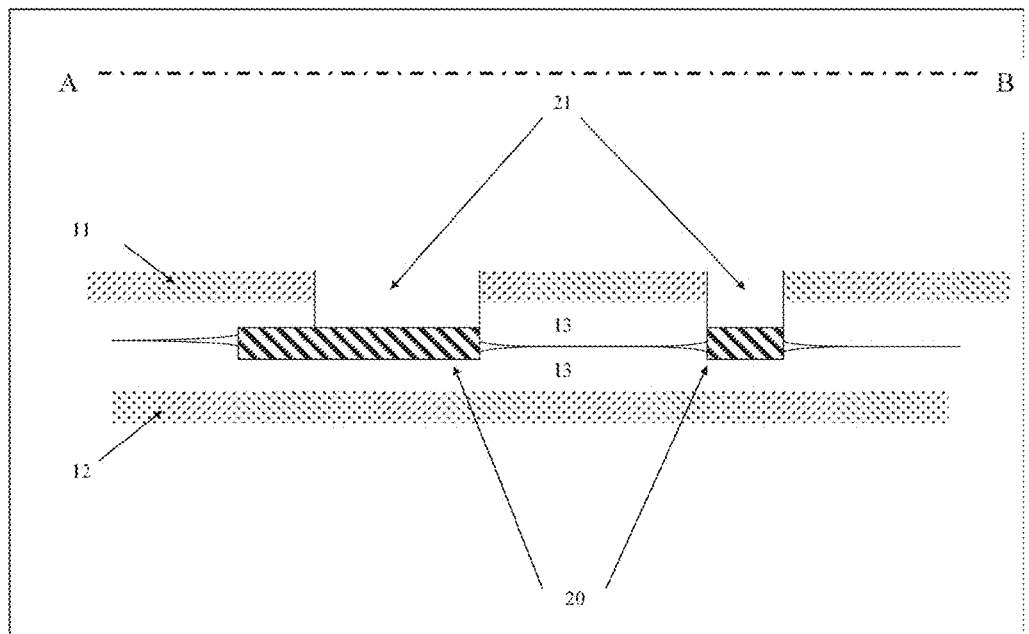
Figure 3a
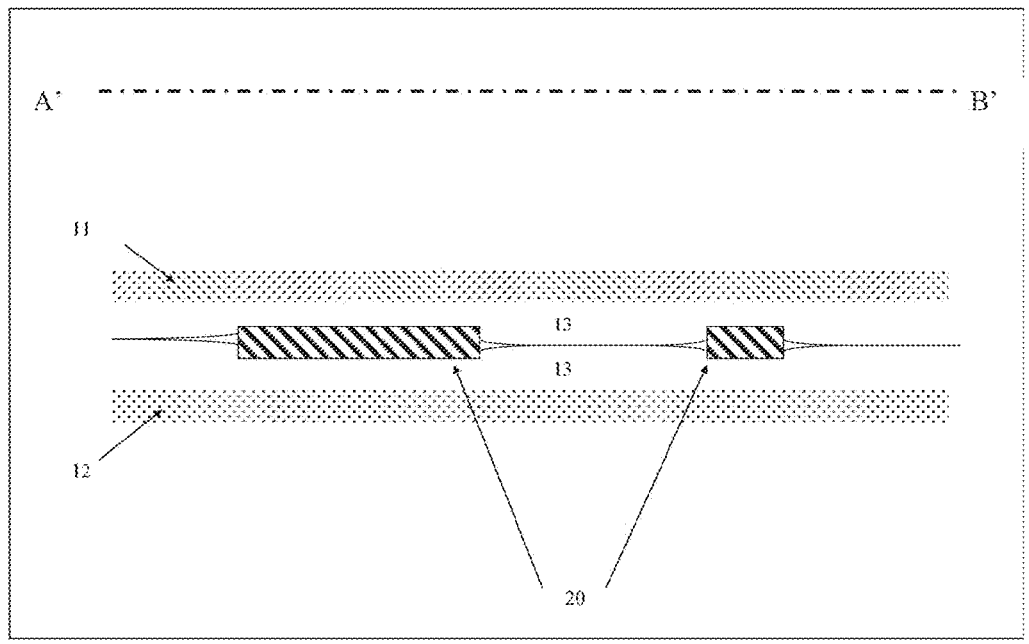
Figure 3b
Figure 3

FLEXIBLE DISPLAY TILE AND METHOD OF PRODUCING SAME

The present invention pertains to the field of displays, in particular to the field of tiled displays.

BACKGROUND

As exemplified by the LED display described in the prior art and in particular U.S. Pat. No. 5,900,850, typical large tiled display devices require bulky structures to support the display tiles and keep them aligned.

U.S. Pat. No. 8,434,963, assigned to ORBUS, and EP 2 459 888 A1, in the name of the present applicant, give other examples of metallic support structure made of pultruded beams. Both documents describe solutions to problems such as axial and planar alignment of display tiles and illustrate problems such as assembly and disassembly of the support structure and concealment of the support structure.

US 2010/0135032 and US 2007/0218751, both assigned to Element Labs, Inc., are more particularly concerned by hanging tiled displays. They offer solutions to simplify assembly and maintenance of such displays but these solutions still present challenges at the time of assembly and disassembly.

EP 1 650 731 A1, in the name of the present applicant, discusses the mounting and fastening of one display element or tile to a display structure. EP 2 110 801 A2, in the name of Element Labs, Inc., is concerned with the fastening of the display element or tiles to a support structure and the alignment of the display tiles. While the solutions proposed in both documents simplify the assembly and servicing of the display element, both the fastening means and the support structure remain cumbersome.

One of the disadvantages of conventional LED display screens is that they are large, thick and heavy. For example, a 1 m² 8×8 LED display module 8 (2088AEG) weighs about 24.6 kg. Strong and heavy frames or supports are needed to support these LED display screens to ensure safety in the assembling process. The thickness of a conventional LED display screen is in the range of 5 cm to 50 cm. These conventional LED display screens are made of rigid PCB and can only be mounted on flat surfaces.

In one embodiment of EP 2 023 391 A2, a flexible LED screen may include a fixation layer coupled to a rear surface of the flexible printed circuit board to facilitate the fixing of the flexible LED screen to a support structure.

The fixation layer includes a plurality of openings sized and shaped to allow the integrated circuits to be situated therein. The fixation layer may be made of magnetic rubber and may have a thickness of about 1.5 mm. The fixation layer serves to fix the flexible printed circuit board on a wall or any supporting structure.

If fixed on a wall, connection means to power, data, and control signals must be provided.

If the flexible LED screens described in EP 2 023 391 A2 are tiles of a larger tiled LED display, the number of power and signal conducting cables and connectors increases rapidly. The number of cables may make the resulting structure very cumbersome. The cables may have to be hidden behind the display for aesthetic reasons, in which case a solution has to be found to guarantee that cables snaking between wall and the fixation layer will not affect the stability of the structure (e.g., by weakening adhesion to the wall) and will not introduce visual artefacts (by local bending of the tiles at those places where cables and tiles are in contact).

The cables may have to be routed between the tiles, in which case the dimensions of the cables will impose a minimum pixel pitch and resolution to avoid visual artefacts caused by pixel pitch variation between the outer pixels of adjacent tiles.

A screen of large dimensions is usually realized by combining several identical screen units of smaller dimensions. In most cases, a seam will be visible at the border between two adjacent units or tiles. Those seams have to be kept as discrete as possible and are often painted in black. To make things worse, thermal expansion can cause the seams to evolve differently across the screen with serious consequences for the visual perception of the displayed image. One of the main specifications of display quality is uniformity in colour and brightness. For a tiled display, obtaining colour and brightness uniformity is often even more difficult, because the tiles and their seams form a regular structure, which is very easily detected by the human eye. It is known that if a human eye observes a uniform plane, even the smallest local non-uniformities, such as a small variance on the mechanical seams, become visible.

Flexible LED strips are now available off-the-shelf (see FIG. 1a). They consist of a flexible substrate with adhesive tape on one side and LEDs and conducting tracks on the other side. The strips can be glued even to irregular surfaces. The flexible substrate is of the type commonly found in electronic appliances. The strips are available as 5 meter rolls. Realizing a display with N>1 rows of M>1 LEDs can be considered easy if there is a wall or surface available to glue the strips. Each strip will also have to be connected to a controller or the strips will have to be daisy-chained with ad-hoc cabling that is likely to be as cumbersome as that of the solutions previously described. The control of the pixel pitch between two parallel strips can be difficult to guarantee, which means that visual artefacts are likely to affect the display synthesized with the N>1 parallel strips.

EP 1 716 553 A1 discloses a flexible tiled display 50 (see FIG. 1b) that solves some of the problems encountered with the LED strips. Flexible strips 30 comprising Light Emitting Diodes (LED) are cut so that each comprises a given number of LED modules 40 and/or has the required length for the flexible display 50. The strips are placed parallel to each other on a peripheral flexible circuit 60. The flexible circuit 60 consists of a flexible substrate (made of e.g. polyimide or PVC) on which electrically conducting tracks 22 have been formed. The tracks 22 connect the flexible strips 30 to supply and control circuits 20 via solder point 21 between tracks 22 on the substrate 60 and tracks 31 on the flexible strips 30. The tracks 22 are located on the periphery of the flexible substrate 60 and the flexible display 50. In essence, the display 50 consists of several tiles 30 spread over a single substrate 60.

The problems with the display proposed in EP 1 716 553 A1 are:

(a) The length L of the portions of conductor strips 31 on both extremities of flexible strips 30 must be at least as long as the width W of the bundle of tracks 22 to allow connections between all tracks 31 and tracks 22. The ribbons being produced continuously and cut to length to fit on the circuit 60, this means that the distance between pixel modules 40 on the flexible strips 30 will have to be equal or larger than W. The achievable resolution is therefore limited by the width of the tracks 22. Indeed, if two tiles 50 were assembled side by side to realize a larger tiled display, L and W have to be equal in order not to introduce visual artefacts caused by variation in the distance between pixels on the adjacent edges of the two tiles.

(b) The flexible strips 30 must be almost as long as the display 50 itself. For large displays 50 this may be a problem. Indeed, flexible LED strips are available as rolls of e.g. 5 meter or 10 meter long. A display with dimensions larger than 5 or 10 m would therefore require the tiling of at least two displays 50 as described in EP 1 716 553 A1, leading to the assembly problems discussed earlier. There would also be a problem between tiles. The distance between tiles would be at least twice the width W of the bundle of conductor strips at the periphery of the displays 50. The pixel pitch across the tiled display would therefore not be constant and lead to undesirable visual artifacts.

(c) If one LED module is defect, on-site servicing will require the replacement of the entire tile 30 on which the defect LED is located as is usually the case for tiled displays (see e.g. U.S. RE 41,603 E). The dimension of the tile 30 being always as large as either the length or width of the display 50, this is not practical for displays several meters across, in particular if the replacement has to be done on site.

(d) The tracks 31 on tile 30 have to conduct power to all the LEDs on that tile. This will either require increasing the thickness of the tracks 31 or change the material of which they are made (impacting flexibility and/or cost) or their width (which may require increasing the width of the flexible strip 30 and decrease the resolution).

(e) The connections (solder points) 21 between tracks 22 and 31 will have to conduct the current needed for all the LEDs on tile 30. For large displays this may lead to reliability issues as current increases linearly with the number of LED on the tile 30.

(f) Even if the strips 30 can be made long enough to extend from one end to another of a very large tiled display 50, the substrate 60 still has to be of one piece. Any problem with the substrate 60 would then require a disassembly of the entire display. For very large displays, this can be too unpractical and/or costly.

US patent application publication no. 2009/0322651 A1, in the name of Thomas Tennagels, relates to a display device for the presentation of visual content at big events and to a display method for the presentation of such content. The device comprises a plurality of display elements (e.g. LEDs or clusters of LEDs) connected with carrier elements, the display elements being disposed in rows. Furthermore, the display device comprises a carrier rail for mechanically fastening the carrier elements and to supply the display elements with voltage and control signals. The rows of the display elements extend at least partially in several directions, starting from the carrier rail. The control signals originating from the carrier rail are transmitted via a feed element in a direction of a display element row, wherein the signals are deflected at a first end of the display element row through a first end cap in the direction of a second end of the display element row, then deflected at the second end of the display element row by a second end cap in the direction of the carrier rail, and deflected back into the carrier rail via the feed element. In the disclosed system, the carrier elements are rigid tubes and the carrier rail is a single piece, common to the entire display device.

In DE 3633565 A1, in the name of Licentia GmbH, in order to fit integrated circuits onto a substrate which is provided with conductor tracks, and to make contact with said integrated circuits, it is proposed additionally to fit a flexible supply lead and then to connect the connecting tabs of the integrated circuits electrically and mechanically to the conductor tracks of the substrate by means of pressure and a non-conductive adhesive, and to connect them to the conductor tracks of the supply cable by soldering. This method does not provide a solution to the problems associated with large modular display systems.

SUMMARY OF THE INVENTION

Embodiments of the present invention solve some of the problems of the prior art by assembling a tiled display, which may be flexible. The display tiles themselves are advantageously made on a flexible substrate in order to accommodate the deformations, caused e.g. by wind when the setup is used outdoors, of the carrier substrate.

For the purposes of the present description, terms such as "top" and "bottom" refer to the side of the panel on which the light emission takes place and the opposite side, respectively, and the term "vertical" refers to the direction perpendicular to the top and bottom planes.

What is desired is a tiled display requiring a minimum of ad-hoc cabling, with as little perceptible discontinuity as possible at the seams (the region of a tiled display between two adjacent tiles), requiring as little support infrastructure as possible, with little or no impact on the reliability of the mounted display (mechanical failure, degrading performances over time and in particular variations of the distance between adjacent tiles, easy maintenance . . . ). The components of the display should be modular to allow the realization of displays with arbitrary numbers of rows and columns of LEDs (or more generally pixel or picture elements) with off-the-shelf components and parts. The display should preferably be flexible, or include flexible components so as to accommodate different geometrical deployments.

According to a first aspect of the present invention, there is provided a tiled display comprising discrete luminous sources distributed over at least two adjacent flexible display tiles, each of the flexible display tiles being configured to drive the discrete luminous sources on it when connected to a power supply and when receiving data and control signals; wherein the power, data and control signals are provided to the tiles trough conducting tracks formed on a carrier substrate, wherein at least one of the conducting tracks extends from one edge of the carrier substrate to the opposite edge of the carrier substrate. The tiled display is preferably flexible.

Modularity of the proposed system is enhanced when at least one of the conducting tracks providing the power, data and control signals extends from one edge of the carrier substrate to the opposite edge of the carrier substrate along the length of the carrier substrate, as shown in FIG. 2b. Modularity means that the same carrier substrate can be used to realize display tiles of different dimensions and/or accommodating tiles of different dimensions from one tiled display to the other as illustrated by FIGS. 6a and 6b.

The modularity is further enhanced when at least one of the power, data or control signals is provided on at least two separate conductive tracks on the carrier substrate.

The modularity is further enhanced when the power, data and control signals are each provided on at least two separate conductive tracks on the carrier substrate. This can be used to improve the reliability of the display panel. Indeed, let us consider a tiled display with each display tiles overlapping two sets of power, control and data signal tracks as illustrated on FIG. 6c. If the power is lost on e.g. one of the conductive tracks; the corresponding signal would still be provided to the tile by the other power track running under the tile. Depending on the design of the display tiles, the power will be available to those LEDs that draw power from the remaining track, thereby allowing a "graceful" degradation of the performance of the system versus all LEDs of the tile being unpowered or the power provided by the remaining track can be redistributed.

The modularity is further enhanced when the pattern of conductive tracks carrying the power, data and control signals is periodical as illustrated on FIG. 2b.

Ease of assembly is achieved by realizing the connections between the tiles and the conducting tracks right under the display tiles. By "right under a tile" is meant that a conductive element will make contact with a conductive track under the tile. This does not exclude that the conductive element can go through the thickness of the tile as is the case with e.g. vias that will conduct the signal on the conductive track on the carrier substrate to the side of the display tile were the LEDs are positioned. Instead of vias, an electrically conductive drawing pin, a.k.a. push pin or thumb pin, can be used. The push pin may comprise an elongate body and a substantially flat head in electrical contact with the body. The body of the push pin will pierce the tile and the substrate carrier at the vertical of a track and will contact the track while at the same time fastening the tile to the carrier substrate. The flat head is used to establish contact with the circuitry on the display tile. Fastening of the tile to the carrier substrate is enhanced by e.g. bending the body of the push pin behind the carrier substrate.

Assembly of the tiled display is made easier in that the electrical connections between a display tile and a conducting track on the carrier substrate are done through pre-existing openings in the carrier substrate at the vertical of the conducting track and pre-existing vias in the display tile. An opening is provided in a layer protecting the conductive track to facilitate the contact with the conductive track. The pattern of openings in the carrier substrate can be periodical. This will further enhance the modularity of a tiled display system according to this invention. Indeed, the dimension of a display tile and the places on the display tile where contact must be made between tile and tracks can be chosen so that identical display tiles can be assembled with a carrier substrate and fill the area of the tiled display with LEDS all spaced at regular intervals and minimize the impact of the inter-tiles seams.

The connection between a conductive track on the carrier substrate and a tile is advantageously made with a conductive glue or a conductive adhesive tape with a metallic conductive core e.g. a copper core as illustrated in FIG. 5. The use of glue facilitate the assembly of a tiled display "on site" i.e. at the place where the tiled display will be used. Using glue instead of rigid connectors or solder points is expected to contribute to an improved flexibility of the display and an improved reliability (glue being more resilient or ductile than most metals used to establish electrical connections).

The enhanced modularity of a tiled display system according to this invention is further illustrated by FIG. 7. A tiled display of arbitrary dimensions can be realized by juxtaposing carrier substrates. To avoid the "fly curtain effect" (e.g. carrier substrates and their tiles swinging independently of each other in the wind), the tiles can be used to fasten two adjacent carrier substrates together by fastening a tile to each of the carrier substrates and connecting it to the tracks on each of the carrier substrate. This may also improve the reliability of the tiled display: if power, data and or control signals were lost on e.g. the left carrier substrate C1, the tiles overlapping the two carriers (e.g. T3 and T4) can, if designed accordingly, act as a bridge and provide the missing signal to the tiles (T5 and T6) entirely connected to the tracks on the right carrier substrate C2.

Adjacent substrates can be solidarized by bridging tiles as described here above. Instead of bridging tiles or in addition to bridging tiles, adjacent substrates can also be adapted to allow mutual mechanical engagement. In one embodiment, adjacent substrates can be "zipped" together. For this purpose, each side of the carrier substrate is equipped with a row of protruding teeth. Fastening the adjacent carrier is done by help of a slider. Instead of protruding teeth, the principle of the dovetail joint can be used, e.g. as used in re-sealable plastic bags. Any combination of shapes that allow being brought into positive engagement by applying an adequate amount of joining force may be used for this purpose. Higher modularity and flexibility of use appears to be achieved when one side of a carrier substrate is provided with a first edge shape, e.g the male component, and the other side of the same carrier substrate is provided with the complementary edge shape, e.g. the female component. The skilled person will be capable of determining the parameters of these shapes that provide an appropriate trade-off between the amount of force required to obtain engagement, and the structural rigidity of the resulting joint.

Snap fasteners or press studs are yet another possible option to fasten two adjacent carrier substrates. To that end, the sides of a carrier substrate are lined with a row of first components of press studs to match second components of press studs on the matching side of adjacent substrate. Higher modularity and flexibility of use appears to be achieved when one side of a carrier substrate is lined with a single sort of press stud components, e.g the male component, and the other side of the same carrier substrate is lined with the other sort of press stud components e.g. the female or grooved component.

The tiles can be connected to the tracks and in particular the control and data tracks in parallel or in series (e.g. the tiles can be daisy chained). Daisy chaining will require that the tracks be interrupted as illustrated on FIG. 6c.

In that case, it is advantageous (as explained for the contacts between tracks on the carrier substrate and the tiles) to have the tracks interrupted at regular intervals. Modularity of the proposed tiled display system will also be further improved if the distance between two consecutive interruptions is smaller or equal to the length of carrier substrate under any of the display tile connected to the conductive tracks.

The full advantage of the proposed invention is obtained when the tiles are identical to each other (at least those at the same level on the same and adjacent carrier substrate).

A further advantage of a tiled display system according to this invention is that a display tile can be cut along a line separating two sets of tracks carrying the power, control and data signals, thereby allowing the realization of a tiled display with a lateral dimension that is substantially equal to an integer number of times the width of a carrier substrate even if one or more of the tiles assembled on the carrier substrates extending over the edge of a carrier substrate. This further advantage is possible if the tiles are designed such that contacts on the tiles are available on the tiles for each sets of tracks on the carrier substrate that a tile can overlap.

With a tiled display system according to this invention, the pixel pitch (i.e. the distance between two adjacent light emitting elements or the distance between two adjacent light emitting elements of the same color in e.g. RGB LED display) does not depend any more on the width of the bundle of tracks 20 and substantial variation of pixel pitch between two adjacent LED tiles can be avoided.

When the tiles must be exposed to humidity (whether hot, humid tropical air or rain), it is known from the art to "pot" or encapsulate the LED modules in e.g. an epoxy resin, a polyurethane compound etc. . . . . . In the prior art, the potting is done "en masse" i.e. as a single group. This is likely to increase the stiffness of a display tile. It is therefore advantageous to pot the LED module by group of e.g. two or in "lines" as illustrated on FIGS. 8a, 8b and 8c, the line being parallel to a direction in which the flexibility must not be decreased.

According to a second aspect of the invention, there is provided a method of assembling the tiled display as described above, the tiled display including at least a first flexible display tile, a second flexible display tile, and a carrier substrate with at least one conducting track, the method comprising arranging the first flexible display tile and the second flexible display tile in an adjacent position, wherein the at least one conducting track of the carrier substrate connects to the first and second flexible display tiles.

According to a third aspect of the invention, there is provided a method to assemble the tiled display according to any of the preceding claims, the method comprising: cutting at least one length of a flexible substrate carrier with at least one conducting track; contacting a first display tile to the at least one conducting track of the carrier substrate; and contacting a second display tile to the at least one conducting track of the carrier substrate.

Cutting the substrate carrier (anywhere) is possible because the track extends end-to-end or is continuous on the carrier substrate. In an embodiment, the contact between each tile and the at least one conducting track is achieved by aligning a pattern of contacts on the display tile with a pattern of contacts on the carrier substrate.

According to a fourth aspect of the invention, there is provided a flexible display tile for use in the tiled display described above. The tile comprises discrete luminous sources, such as LEDs, arranged to be driven as part of a display system by appropriate power, data, and control signals. The tile may be made on a flexible substrate.

It is a further insight of the inventors that in the systems and methods described above, flexibility can be pushed to an extreme by custom positioning and fastening of the conducting tracks on the surface targeted for installation of the tiled display. The tracks can either be realized with e.g. copper tape positioned in parallel on said targeted surface. The parallel copper tracks are positioned so as to reproduce the distribution of tracks on one substrate carrier or several adjacent carriers. The flexible tiles are then
connected to the tracks as if the surface with tracks were a carrier substrate or a set of adjacent carrier substrate. Instead of copper tape, electrical wire (preferably flat) fastened with glue to the target surface can be used. If the target surface is a fabric or cloth like e.g. a sail, the wire can be woven into the fabric (i.e. pierce the sail at regular intervals) and the sail itself become the carrier substrate.

According to a fifth aspect of the invention, there is provided a flexible display tile comprising a plurality of luminous sources, said flexible display tile being provided with a plurality of enclosures that are positioned around one or more of said luminous sources, wherein the enclosures are filled with a potting material.

The luminous sources may be diodes, or other equivalent sources known in the art. The number of luminous sources in each enclosure is less than the total number of luminous sources on the tile. Thus, the luminous sources are divided into groups, around which enclosures are arranged. Such a group may comprise just one luminous source. Preferably, such a group comprises at least two luminous sources. The group may also comprise a larger number of luminous sources, such as 4 or 8. The space enclosed by the enclosure may include other electronic components, beside the luminous sources, preferably components whose function is directly related with the luminous sources within the same enclosure. For the purpose of the following description, the enclosures are considered to have a length L and a width l.

The enclosures allow delimiting the regions of a tile where the potting material must be present and the regions of a tile where no potting material is desired. It is an advantage of the present invention that the potting can efficiently be limited to the regions where it serves its protective function, without rendering the entire tile too rigid for use in a flexible system.

In an embodiment of the invention, a portion of the enclosures is arranged so as to provide shading to the luminous sources within the enclosure.

In particular, a portion of the enclosures may be shaped as a louver. It is an advantage of this embodiment that the quality of the displayed image is improved by keeping stray light from reaching the luminous sources.

In a further embodiment of the invention, the enclosures are elongate and arranged with their longest side aligned with a principal direction of the flexible display that, in use, corresponds to the smallest curvature of the flexible display.

The smallest curvature in use may be defined as the smallest curvature that is expected to occur during operation of the flexible display.

This has the advantage that the flexibility of the assembled display will not be substantially less than the flexibility of the carrier substrate.

In a further embodiment of the invention, the enclosures are arranged with their longest side aligned with an axis around which the display tile is designed to be rolled.

This has the advantage that the display can be rolled and unrolled by a human manipulator as easily as possible for transport and storage purposes. This has also the advantage that the potting material will not introduce regions of higher stress in the tiles, the carrier substrate, the electronic components, and the electrically conductive tracks present on the tiles and the carrier substrate.

In a further embodiment of the invention, the display tile comprises at least one conductive track, wherein at least one corner in said at least one conductive track is covered by said potting material.

Any corners in the conductive tracks on the flexible display tile are preferably positioned within the region of the tiles where potting material is present, so as to improve their mechanical robustness. In particular, the corners present in the conductive tracks are preferably positioned under the enclosures. This has the advantage that the mechanical stress in the conductive tracks is decreased which prevents or delays the apparition of cracks in the conductive tracks.

In a further embodiment of the invention, the plurality of enclosures is arranged in rows and/or columns, wherein the display tile is configured to allow separation into smaller tiles along at least one line between two of said rows and/or columns.

Accordingly, the display tile is configured in such a way that it can be cut along a line passing between two columns of enclosure elements and/or along a line passing between two rows of enclosure elements, each enclosure delimiting a potted island on the tile. This has the advantage that the dimensions of a tile can easily be modified to realize a tiled display of a desired length and width that would otherwise require a tailor made tile.

According to a sixth aspect of the invention, there is provided a method of producing a flexible display tile, the method comprising: providing a plurality of luminous sources on a flexible substrate; arranging each one of a plurality of enclosures around one or more of said luminous sources; and filling said enclosures with a potting material.

By applying these steps, a flexible display tile according to the fifth aspect of the invention is obtained, with the advantages described above.

The flexible display tile according to the fifth aspect of the invention and the method of producing same according to the sixth aspect of the invention are especially suitable for use in the first, second, third, and fourth aspects of the invention, and the features of the various embodiments of the former aspects are expressly stated to be combinable with the latter aspects.

BRIEF DESCRIPTION OF THE DRAWINGS

These and other features and advantages of embodiments of the present invention will now be described in more detail with reference to the accompanying drawings, in which:

FIGS. 3a and 3b represent cross-sections as indicated in FIGS. 2a and 2b;

DETAILED DESCRIPTION OF THE INVENTION

Figure 1A:
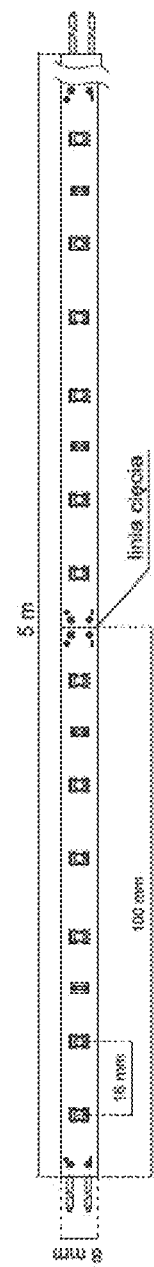
FIG. 1a illustrates a flexible LED strip.
Figure 1B:
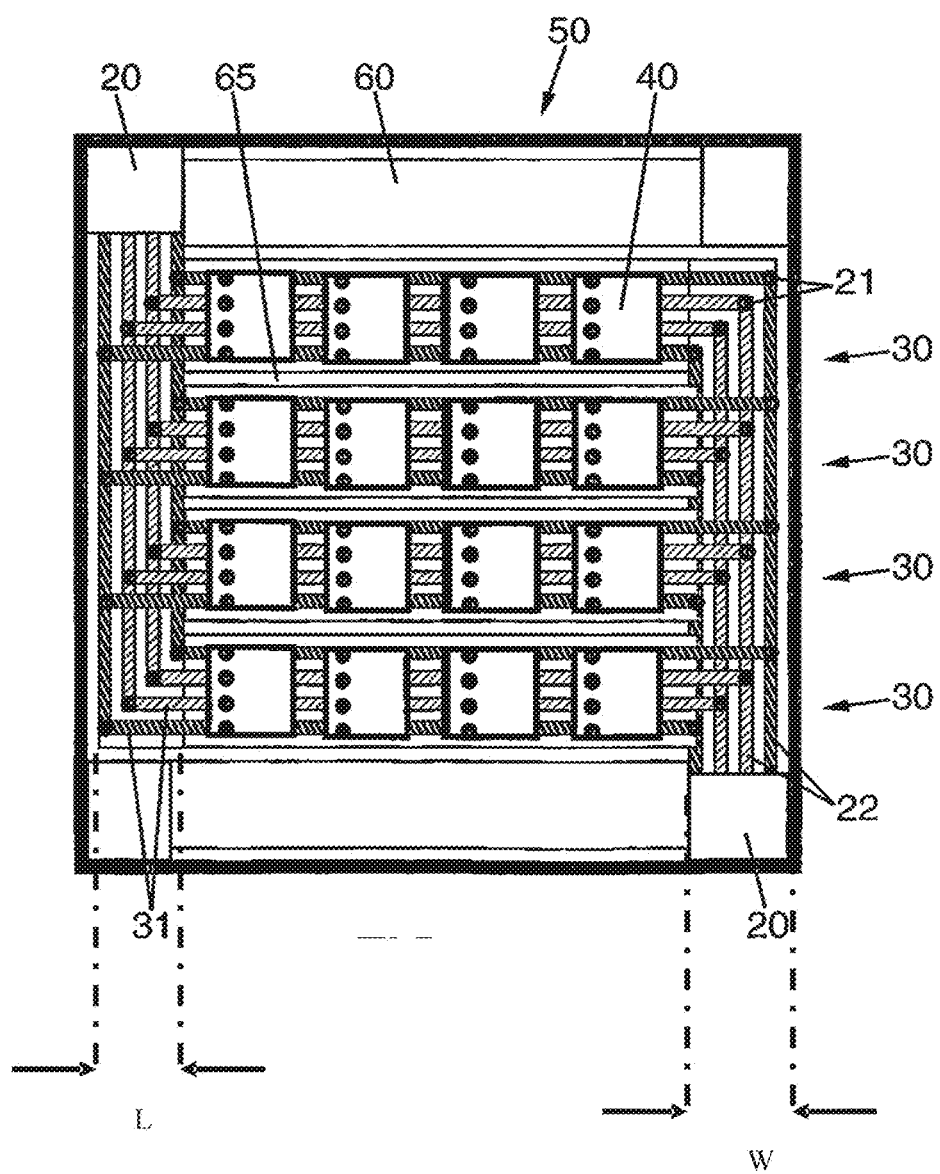
FIG. 1b illustrates a display disclosed in EP 1 716 553 A1.
Figure 2A:
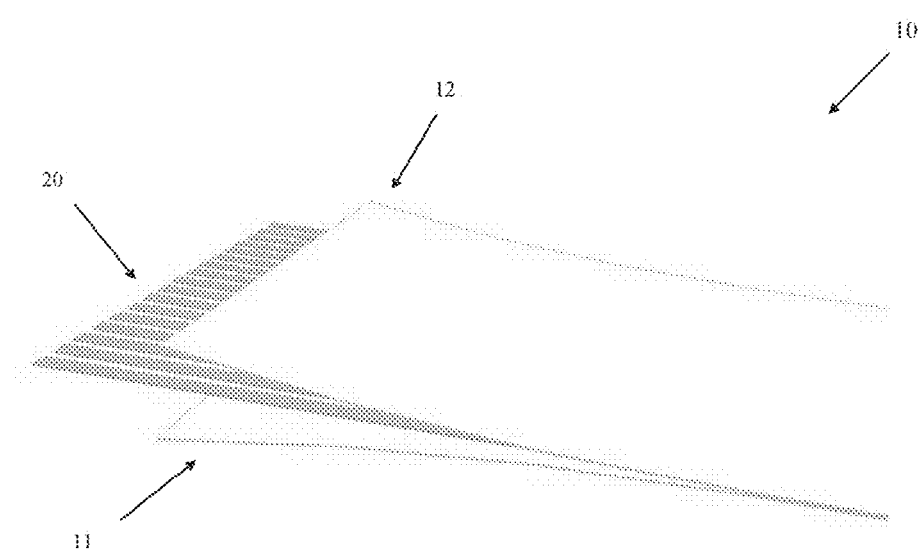
FIGS. 2a and 2b illustrate a flexible substrate with electrically conducting tracks according to an embodiment of the invention.
Figure 2B:
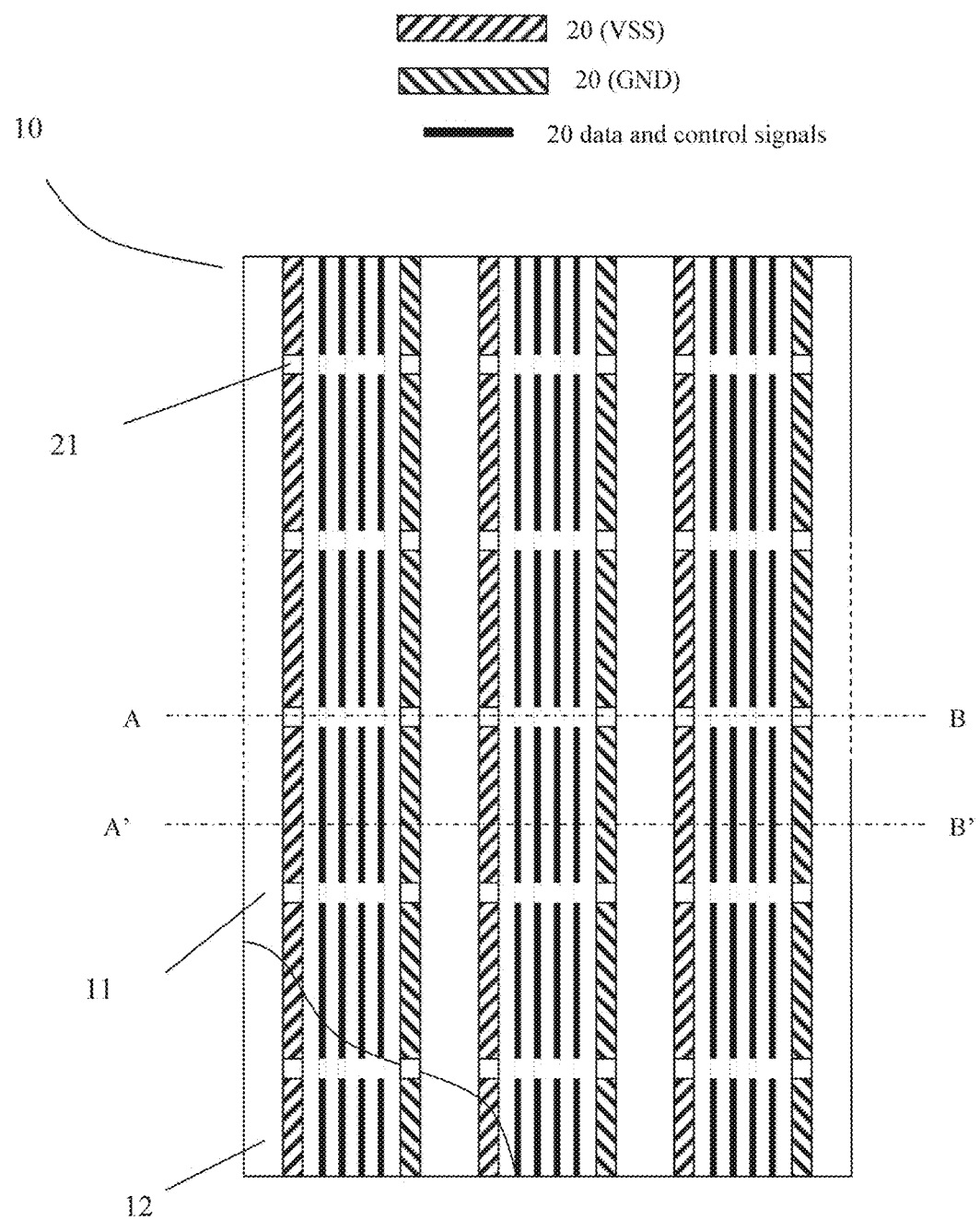

FIGS. 2a and 2b show a flexible substrate 10 with electrically conducting tracks 20 according to an embodiment of the invention. Each one of the conducting tracks is meant to carry power, data or control signals to LED tiles. For instance, power is conducted through the GND and VSS tracks. The other tracks carry a DATA CLCK signal, DATA (or Video Signal) and COMMAND SIGNAL (the signals considered in e.g. U.S. Pat. No. 7,102,601 to control a tiled LED display; U.S. Pat. No. 7,102,601 is assigned to the present applicant, and its contents, including in particular the description of FIG. 2 therein, are incorporate herein by reference for the purpose of describing the cited signals). The tracks carrying DATA CLCK, DATA and COMMAND SIGNAL may be interrupted at regular intervals as will be discussed in more detail further below.

In a first preferred embodiment, the conducting tracks 20 are positioned between a first material layer 11 and a second material layer 12. The first and second layers 11 and 12 can be made of the same material (e.g. a polyimide). Layers 11 and 12 are preferably made of an insulating material. Additional layers can come between the first or second layer and the conducting tracks. Both layers 11 and 12 can have the same or different thicknesses. While the description will mainly consider a polyimide for layers 11 and 12, other materials including textiles and cloths may be used.

The conducting tracks can be made out of copper foil. A typical thickness for the conducting tracks is 10 to 100 μm, giving a lot of flexibility to the substrate 10 with low risk of mechanical fracture along the tracks 20. Other conducting materials can be used like e.g. gold or aluminium. Indium Tin Oxide (ITO) may even be contemplated for low power tiled displays (e.g. reflective displays where electrophoretic elements, e-paper or even liquid crystal elements would replace the LEDs on the tiles) that do not require high drive current for prolonged periods of time.

The flexible substrate 10 or carrier substrate can be produced continuously as rolls of a fixed width.

The copper tracks 20 can be laminated between two polyimide foils 11 and 12 as schematized on FIG. 2a to form a flexible substrate 10.

If the layers 11 and 12 are made out of a fabric or a cloth, the conductive tracks 20 can be electrical wires glued to, woven into or embroidered on one or both of the layers 11 and 12. The conductive tracks can also be formed on one of the foils 11 or 12 by a usual deposition process followed by a selective etching process. The layers 11 and 12 are then glued or laminated together. In some cases, for displays operating in mild atmospheric conditions, it may even be sufficient to form the conducting tracks on a single polyimide foil and cover them with a varnish.

Openings 21 are made in one of the polyimide foils to allow access to the copper tracks. Those openings are made at regular intervals along the length of the substrate 10 as exemplified on FIG. 2b. FIGS. 3a and 3b show a partial cross section of the carrier along axis AB and A'B' respectively (the cross section is not given from one side to the other along axis AB but is limited to the first few copper tracks 20). Each of the layers on FIGS. 3a and 3b has a typical thickness of 25 µm to 100 µm.

The openings 21 can be made with any suitable mechanical or chemical process like but not limited to e.g. punching, laser . . . before or after assembly with the copper tracks. If the conductive tracks were merely covered with a varnish, the openings 21 may be obtained by masking the places where openings 21 are needed with e.g. a stencil. After the varnish has been sprayed, the masks are withdrawn, leaving an opening 21 on the conducting tracks for connection to other conductors and electronics as will be described later. When we will refer to conductive tracks being formed on the carrier substrate 10, it will be understood that the conductive tracks can be either sandwiched between two foils, formed on a single layer or woven or knit as electric wires within the fabric of a cloth.

Electrical connection between the conductive tracks and the tiles is preferably done by means of a conductive adhesive with copper core 32. The conductive adhesive 32 is in contact with tracks 31 on the other side of tile 30 preferably trough a conductive via 33. An example of the structure resulting from the assembly of a tile 30 and a carrier 10 is given on FIG. 4. A cross section along the axis CD on FIG. 4 of a tile and the supporting carrier is given on FIG. 5.

Table 1 gives examples of materials that can be used for the connections 22, the tracks 20, and the foils between which the tracks are sandwiched and the adhesive used to assemble the different materials.

TABLE 1

| | |
|---|---|
| 20 | Copper foil |
| 11, 12 | Polyimide |
| 13 | acrylic adhesive |
| 22, 32 | Self adhesive conductive tape |

The polyimide (11, 12) and the acrylic adhesive (13) are presently available off-the-shelf as laminate.

The conductive adhesive with copper core is presently available off-the-shelf as tape with a thickness of approximately 80 µm.

Figure 4:
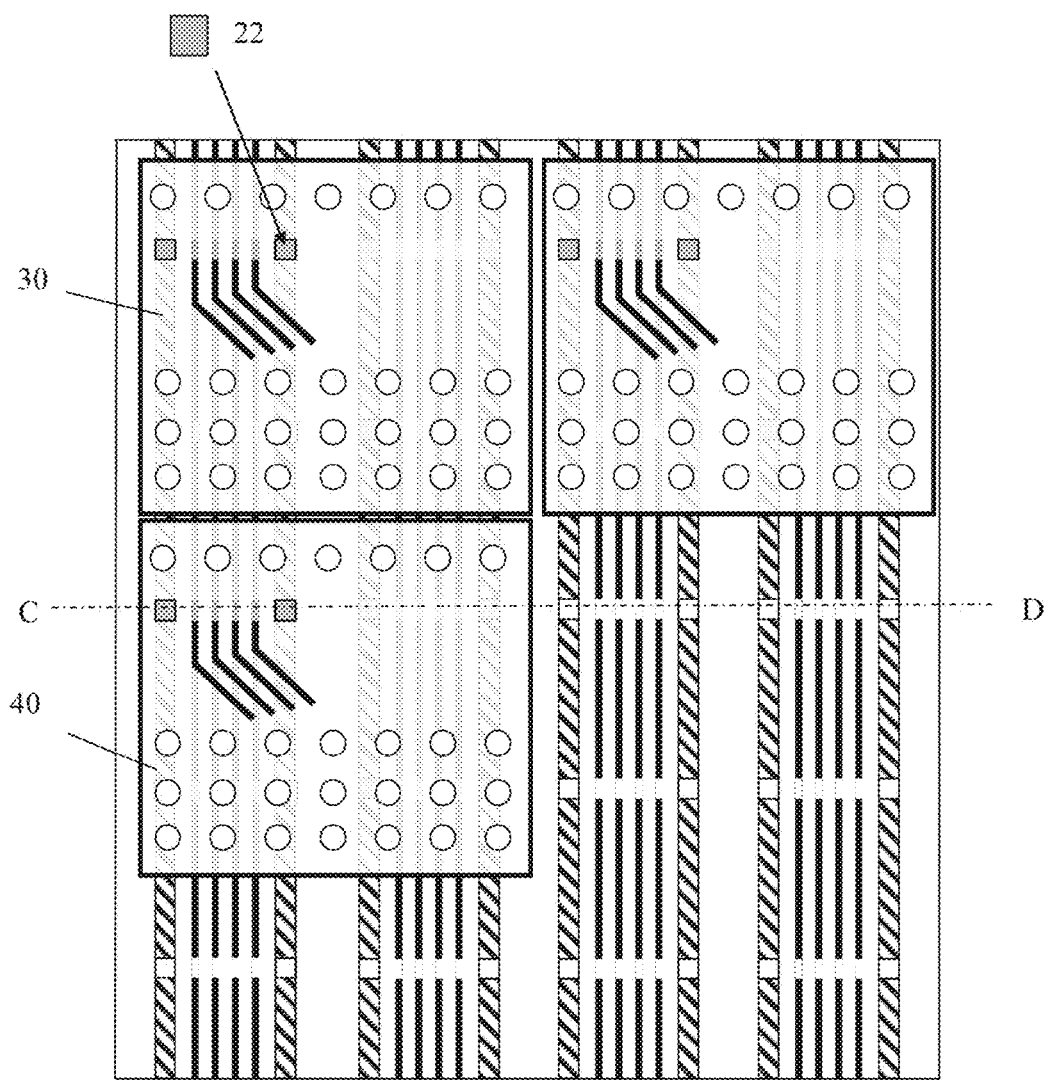
FIG. 4 illustrates an exemplary embodiment of a tiled display according to the invention.
Figure 5:
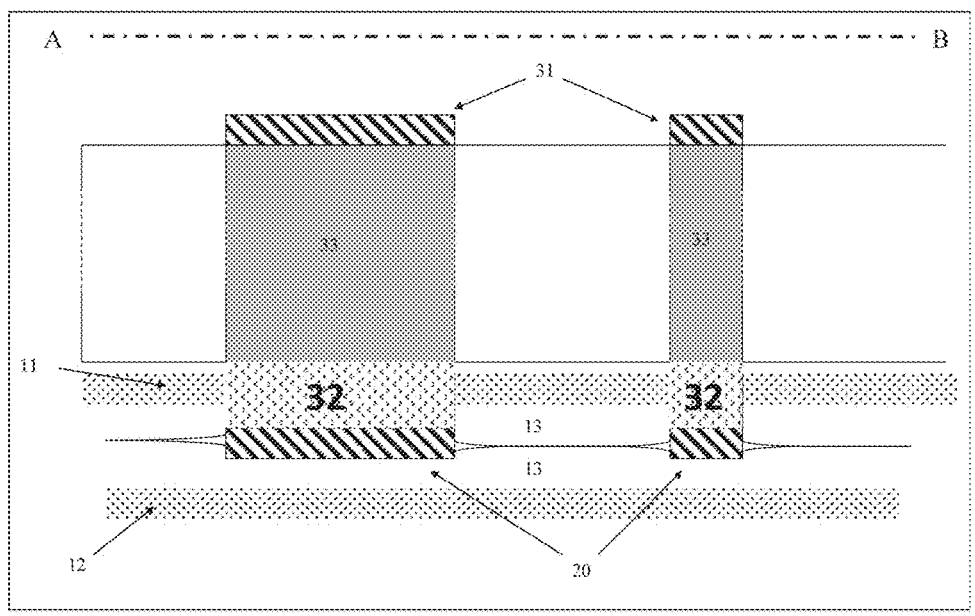
FIG. 5 represents a cross-section along axis CD as indicated in FIG. 4.

FIG. 4 shows an exemplary embodiment of a tiled display according to the invention. LED tiles 30 and 40 are assembled (e.g. glued) on the carrier substrate 10. The carrier 10 is easily obtained by cutting the required length of carrier from a roll of carrier described earlier.

The tiles 30 and 40 are printed circuit boards on which LED modules and the associated electronics are assembled on a first side of each tile (by gluing, soldering or any other adequate technique). The printed circuit boards are advantageously flexible printed circuit boards. Connections 22 between the circuit on tiles 30 and 40 and the tracks on the carrier are made with patterned self-adhesive conductive tape 32 on the second side of each tile.

The pattern of connections 22 on the self adhesive conductive tape on a second side of the tiles 30 and 40 matches the pattern of openings 21 on the carrier substrate 10.

Figure 6A:
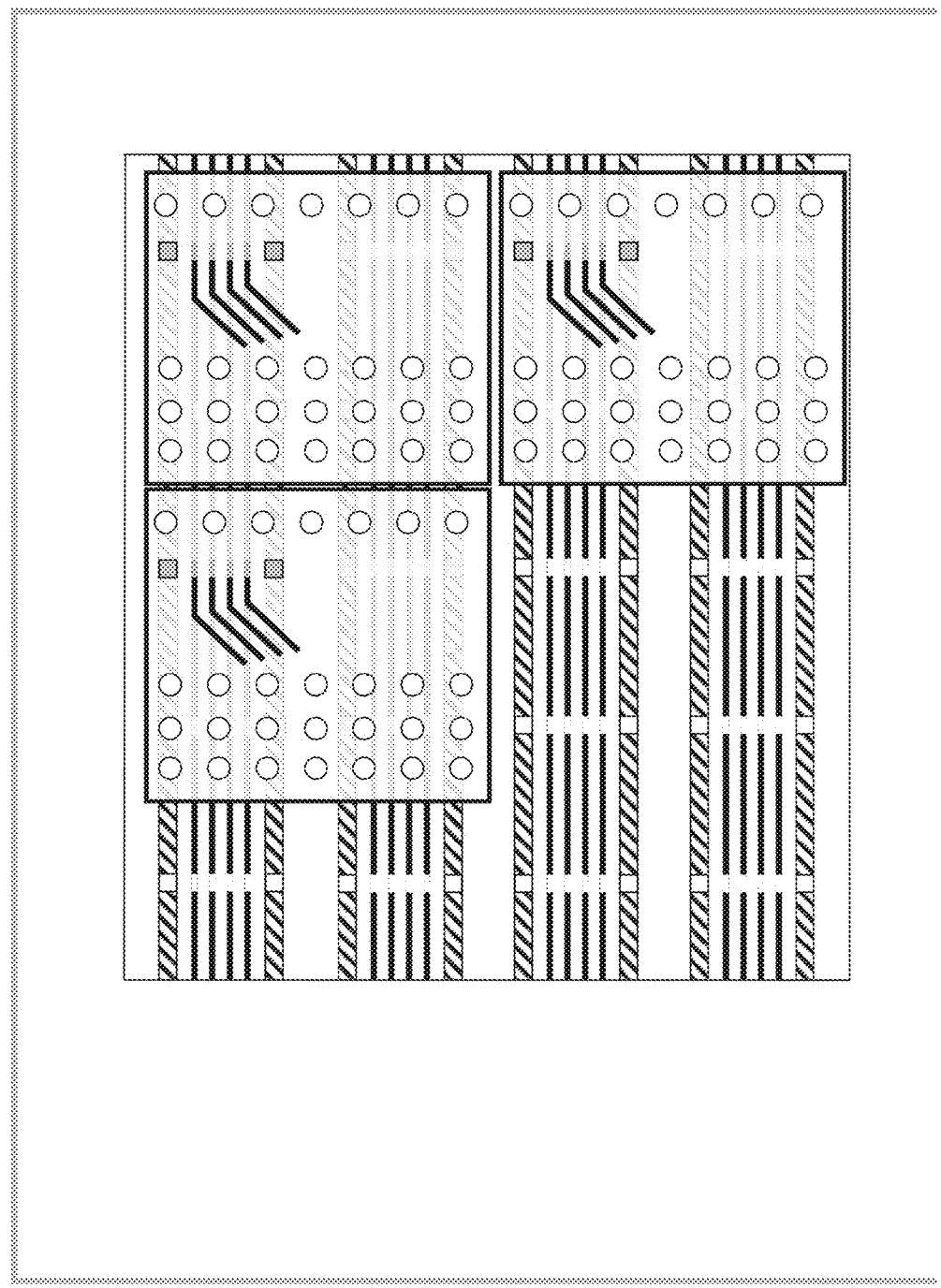
FIGS. 6a and 6b illustrate the use of a same carrier substrate to accommodate tiles of different dimensions.
Figure 6B:
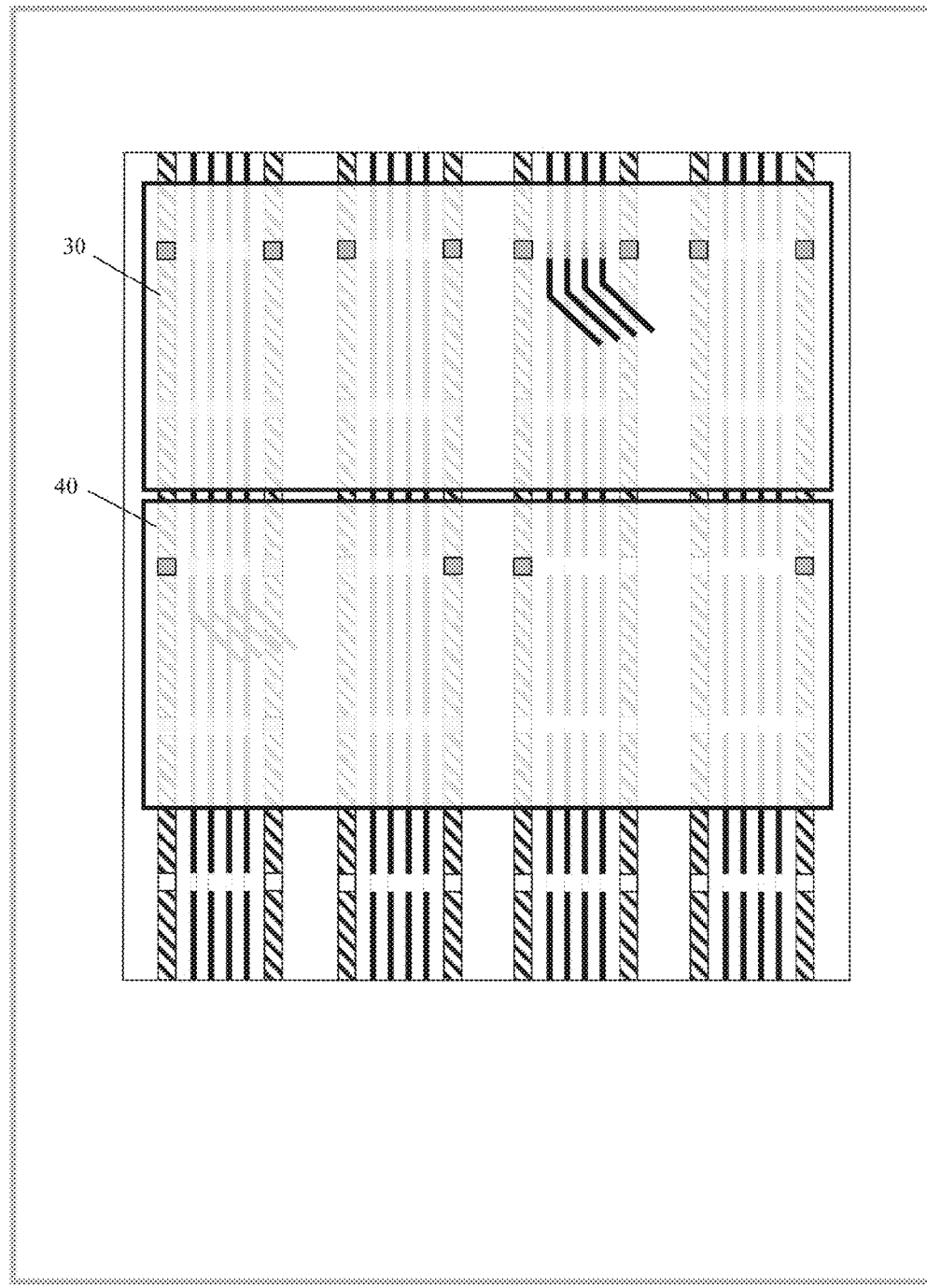

The periodicity with which the openings 21 are made in the carrier 10 enables to use the same carrier substrate with tiles of different dimensions in function of the application as exemplified on FIGS. 6a and 6b.

Adhesion between the carrier substrate and a tile need not be limited to the connections 22. A punch through sticker can e.g. pre-positionned on the back of a tile. Holes are punched in the sticker where connections 22 are expected. Assembly of the tiles onto the substrates then involves establishing adhesion of the aforementioned self adhesive conductive tape as well as the punch through sticker.

The data and control signal tracks on the carrier substrate 10 can be continuous as on FIG. 2b or interrupted at regular intervals as on FIG. 2c.

Continuous data and control signals tracks require that the tiles on the carrier be addressed in parallel (all tiles receive the signal at the same time).

Figure 6C:
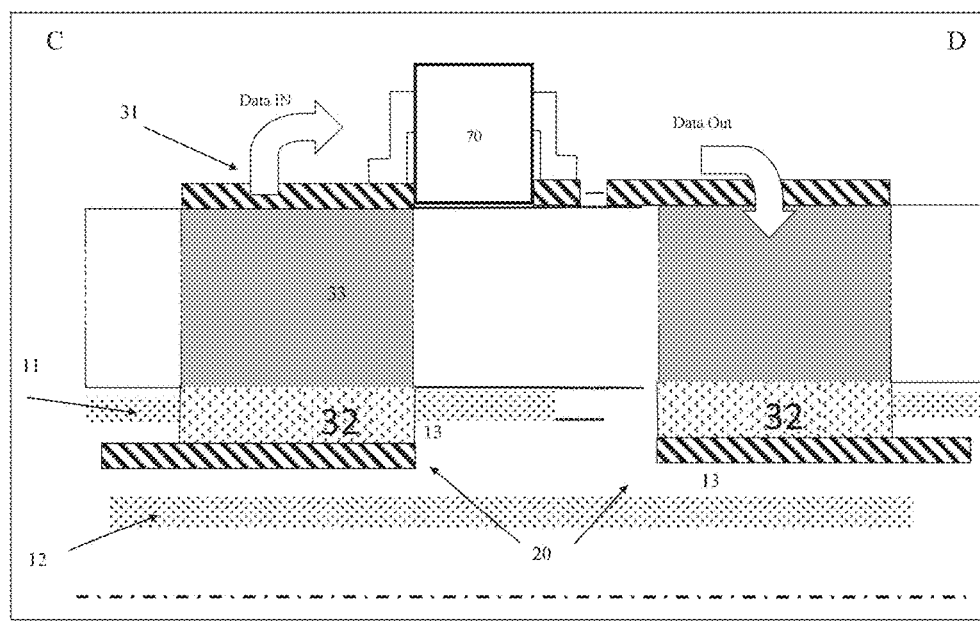
FIG. 6c illustrates the interruption of the tracks to daisy chain two tiles with respect to the command and/or the data signals.

When the data and control signal tracks are interrupted, the tiles are designed to transfer the data and control signals they receive to the next tile through the next portion of conducting tracks on the carrier. This is exemplified by FIG. 6c that gives a cross section along one of the data and control signal tracks. An example of daisy chained tiles in a tiled LED display is described in U.S. Pat. No. 7,071,620 "Display pixel module for use in a configurable large-screen display application and display with such pixel modules", assigned to the present applicant. As described in U.S. Pat. No. 7,071,620 and seen on FIG. 6c a resyncer unit 70 receives and re-transmits the serial video and serial control data directly from one LED module array 30 to a next LED module array 40 in a sequential string of LED module arrays 100. More specifically, the resyncer unit 70 receives a DATABUS IN signal, which is representative of serial video and serial control data, and transmits this data to the next device in sequence via a DATABUS OUT signal. A detailed example of the electronics that can be found on a tile 30 is also given in U.S. Pat. No. 7,071,620. The cited parts of U.S. Pat. No. 7,071,620 are incorporated herein by reference.

How the signals are transmitted by daisy chaining from one tile at the border of the display to the next tile of an adjacent tile column (tiles at top of FIGS. 6a and 6c) will be described further below.

Figure 7:
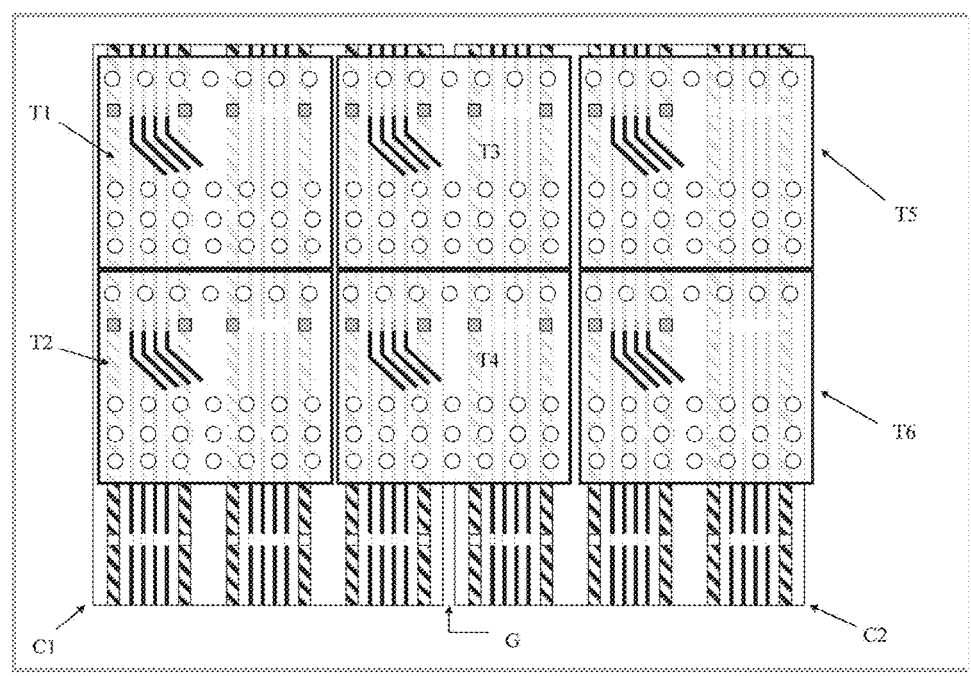
FIG. 7 illustrates an arrangement where tiles are used to fasten two adjacent carrier substrates together.

Repetition of the power, control and data signals bus on the carrier 10 offers the possibility of fastening two adjacent carrier substrates 10 by means of tiles overlapping and fastened to those two adjacent carriers. This possibility is illustrated on FIG. 6. In FIG. 7 two carriers C1 and C2 are placed parallel to each other. A gap G exists between the carriers C1 and C2. Tiles T1 and T2 are fastened and connected to the first carrier C1. Tiles T5 and T6 are fastened and connected to the second carrier C2. The tiles T3 and T4 overlap parts of the carriers C1 and C2. The tiles T3 and T4 are fastened and connected to both C1 and C2; thereby binding the two carriers together. The bridging of carrier substrates C1 and C2 by tiles T3 and T4 makes it possible to increase the robustness of the tiled display. If for instance, power was not distributed anymore by the conducting tracks on C1, bridges on T3 and T4 can bring power to the tiles T1 and T2 on C1 by connecting them to the conducting tracks on C2. The same can be done for the data and control signals, especially if the data and control signal tracks on the carriers are continuous and the tiles of the display are addressed in parallel.

The invention thus enables the realization of arbitrarily large displays tiles that can vary in dimensions from one display to the other while using the same format of carrier substrate 10.

Connection of the tracks (power, data and signal tracks) at a first end of a carrier track 10 to an external controller can be made by soldering the wires of a standard cable to the tracks 20 through the first set of openings 21.

A more practical solution is to use a clamping connector as now described.

The clamping connector 80 comprises two main parts 81 and 82. Parts 81 and 82 can be joined by a hinge but this is not strictly necessary. In their simplest form, 81 and 82 are two beams made of any suitable material and with dimensions sufficient to bear the weight of the flexible display 50. The two beams are preferably longer than the carrier substrate is wide and preferably as long as N times the width of a carrier substrate 10 (N being an integer larger or equal to 1) to enable assembly of displays with an arbitrary number M of carrier substrate 10 in parallel with 1≤M≤N.

A circuit 83 with at least one set of tracks 84 can be inserted between the beams 81 and 82. The ends of the tracks 84 have a pattern that corresponds to the pattern of openings 21 on the carrier substrate 10. The circuit 83 can be flexible and manufactured similarly to the carrier substrate 10. Openings 85 at the end of the tracks 84 give access to the conducting tracks 84. The tracks 20 on the carrier substrate 10 and the tracks 84 on the flexible circuit 83 can be done e.g. with conductive glue, conductive tape or any other methods to bring the tracks in good electrical contact. This could be done e.g. by clamping the carrier substrate 10 and the flexible circuit 83 together by mean of the beams 81 and 82.

The beams 81 and 82 are held together with any practical means. In particular they can be held together with bolts and nuts, the bolts going through both beams 81 and 82. The openings for the bolts can be placed so that the bolts will pierce the carrier substrate 10. This can enhance the fixation of the carrier 10 to the connector clamp 80.

The circuit 83 is advantageously assembled to one of the beams 81 or 82. The tracks 84 are connected to one or more connectors 850 integral to the beam 81 or 82 to which the flexible circuit 83 is assembled to.

Pressure is applied to the stack consisting of beam 81, substrate carrier 10, flexible circuit 83 and beam 82 in a controlled manner by means of the bolts 86 and nuts 87 e.g. with a dynamometric torque wrench.

Connection of the display 50 to an external controller circuit and to a power supply or the local electrical network is then easily done with any type of cable corresponding to the one or more integral connectors 850.

Driver electronics to send or relay control and data signals to the display tiles and/or stabilized power supplies can be positioned in the clamp connector itself. There can be one driver units per set of tracks on a carrier substrate, one driver for one or more carrier substrate or a single driver for all of the carrier substrates.

A second clamp connector 90 can used at the second end of the carriers 10. Clamp connector 90 differ from the clamp connector 80 mainly by the layout of conductive tracks 94 on a flexible circuit 93 that will connect to the conductive tracks 20 on the carrier substrate 10. The tracks 94 can be adapted by e.g. a cutting operating of specific tracks 94 to tiles of different sizes. In its simplest form, the second clamp connector has no conductive tracks and acts only as ballast to keep the flexible displays under tension and avoid excessive displacement of the flexible display e.g. in the wind. In some instances the conducting tracks 94 are mere "jumpers" that connect two adjacent sets of tracks (on the same carrier substrate or on adjacent carrier substrates). When the tiles are operated in parallel, no tracks 94 are strictly necessary for the data and control signals.

The VSS and GND tracks on different substrate carriers 10 clamped by the clamp connector 90 are advantageously connected in parallel through the flexible circuit 93. This is expected to enhance the reliability of the system: should one or more of the power tracks on a carrier substrate 10 be damaged by e.g. sectioning of a conductive track, connection to the power tracks will be assured on both sides of the section thanks to the connections to the corresponding power tracks on the same carrier substrate 10 or on parallel carrier substrates of the display.

A clamp connector can be equipped with ball bearings 100 and 101 and e.g. a toothed wheel 102. Axles 103 and 104 part of a support structure 105 that can be fixed to a vertical surface 106 and the ball bearings fasten the clamp connector to the vertical surface 106. A mechanism 107 that can be part of the support structure 105 can turn the clamp connector e.g. through the toothed wheel 102 thereby enrolling or unrolling the tiled flexible display around the beams 81 and 82. Advantageously, beams 81 and 82 form a cylinder when assembled to ease rolling and unrolling of the flexible display. Rolling the flexible display at will can be advantageous to protect the flexible display when it is exposed to strong wind and/or rains.

The second and first connectors can also be used for mounting of the display to a vertical surface e.g. a wall. One of the connector can be fixed with reduced infrastructure to the wall, the other connector can be left hanging. The connector left hanging is weighed to provide tensioning to the flexible display thereby avoiding wild swings that can be caused by wind. The second connector can also be fixed to the wall just as the first one.

Interestingly, one of the connector can be assembled to the flexible display in the factory and the display rolled around that connector before shipment. Once on site, the connector is fixed to the wall at both ends and is used as the drum of a pulley to unroll the display in a controlled manner. When the display must be disassembled, it is used as a pulley to roll back the display.

In the remainder of the description, we will make reference to the curvature and the radius of curvature of a surface at a point and in a given direction Dx.

To clarify the description, and without loss of generality, the directions 'D1' and 'D2', which will be used hereinafter, can be mathematically defined as follows. At each point P of a (differentiable) surface S one may choose a unit normal vector N. A normal plane Π at P is one that contains the normal, and will therefore also contain a unique direction tangent to the surface and cut the surface in a plane curve. This curve will in general have different curvatures (and radii of curvature) for different normal planes at P. The principal curvatures at P, denoted $k_1$ and $k_2$, are the maximum and minimum values of this curvature. The directions D1 and D2 (parallel to the tangents T1 and T2 to the surface S) corresponding to the maximum and minimum curvatures, respectively, are the principal directions.

Figure 9A:
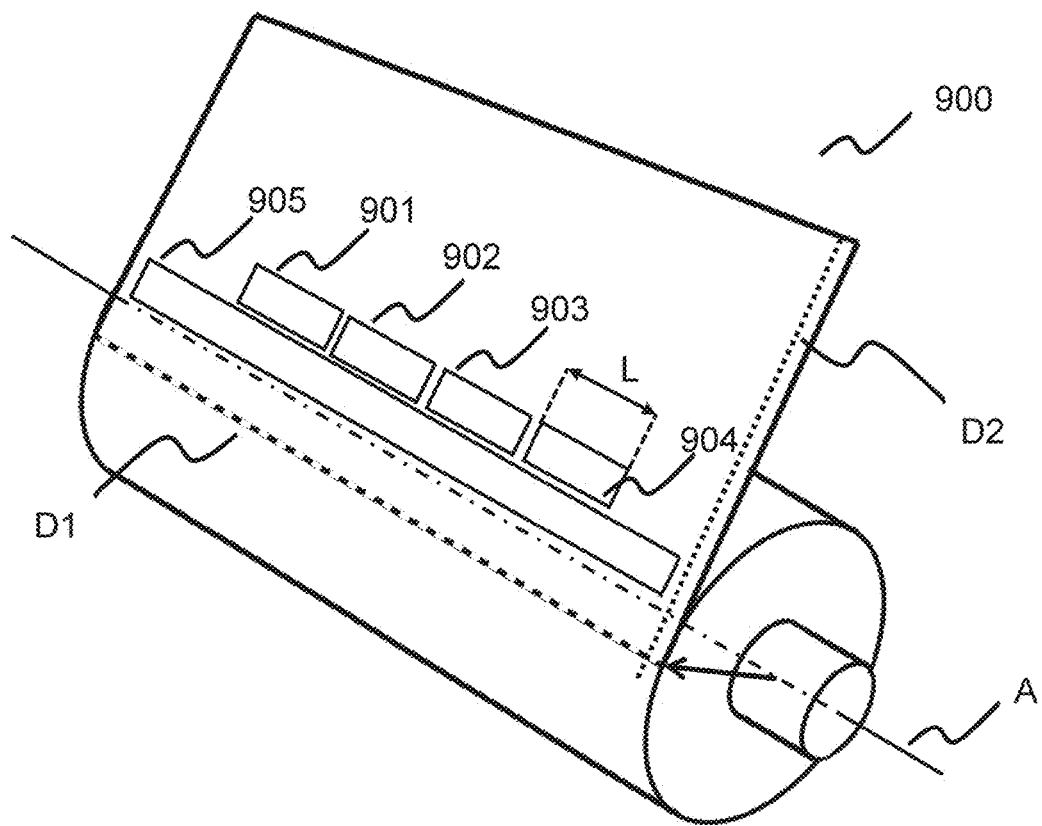
FIG. 9a-c show a flexible display that can be rolled around an axis.
Figure 9B:
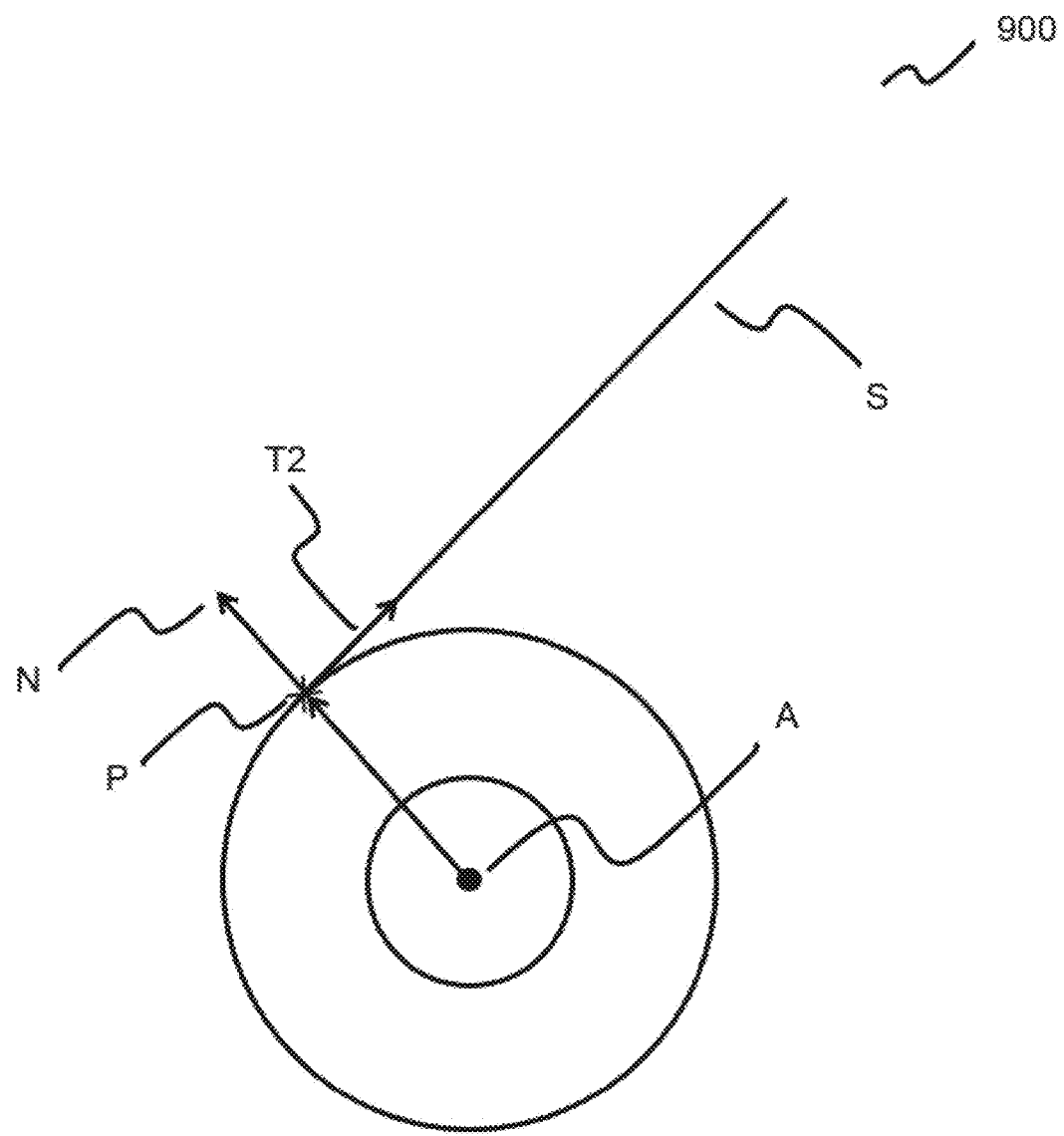
Figure 9C:
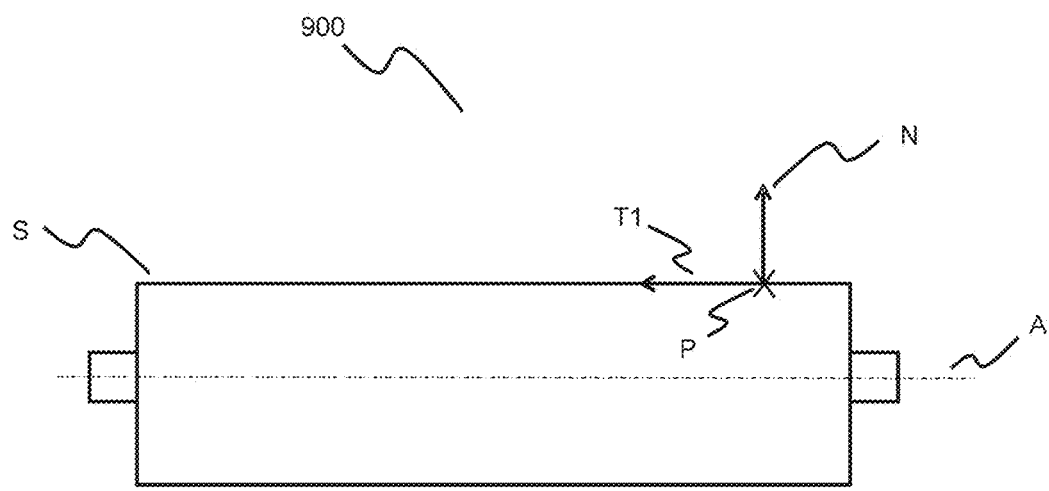

FIGS. 9*a*, 9*b* and 9*c* show a flexible display 900 that can be rolled around an axis A. In normal use, the maximum radius of curvature and the minimum curvature will be associated to the direction D1 parallel to the axis A while the minimum radius of curvature and the maximum curvature will be reached in the direction D2 perpendicular to the axis A. We will use this result further below.

Figure 8A:
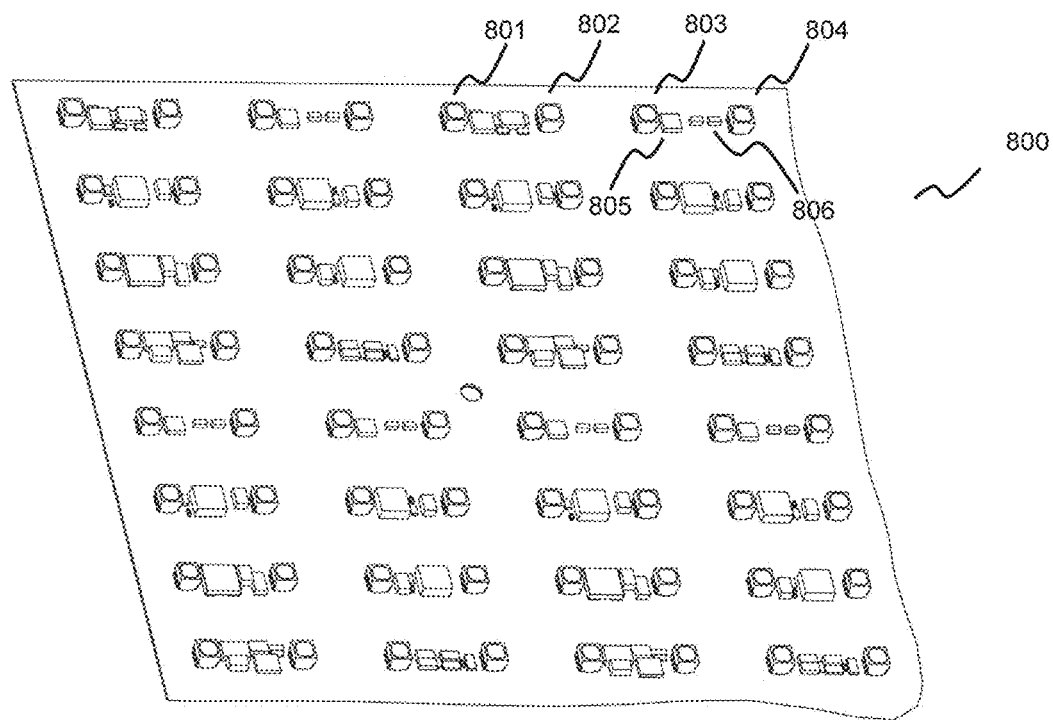
FIGS. 8a-e show LEDs and other electronics components that have been assembled on a display tile according to an embodiment of the present invention.
Figure 8B:
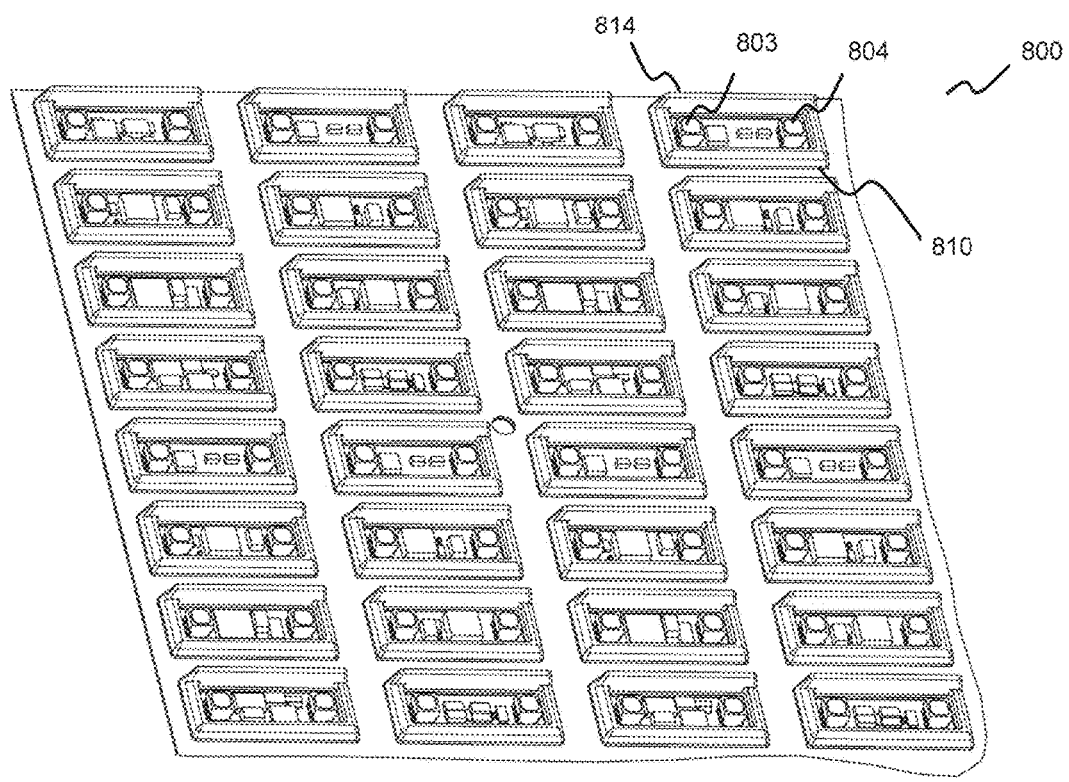
Figure 8C:
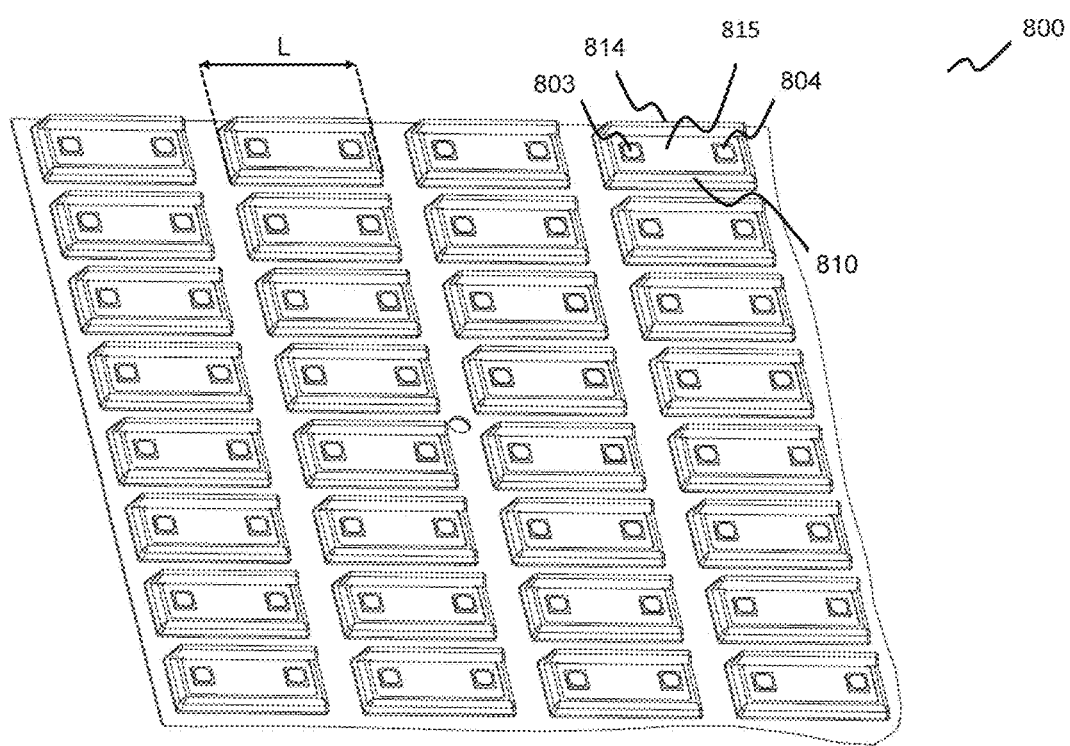

FIG. 8*a* shows LEDs (801, 802, 803, 804) and other electronics components (805, 806) that have been assembled on a display tile 800. Following assembly of the LEDS and other electronic components, an enclosure 810 is positioned around e.g. two diodes 803 and 804 as well as the electronic components 805 and 806 associated with the diodes 803 and 804 and located between diodes 803 and 804. The enclosure 810 may be a preformed component that is e.g. glued on the tile or it can be formed on the tile by dispensing a material e.g. silicone rubber on the tile. As is the case on FIGS. 8*b*, 8*c*, 8*d* and 8*e*; the preformed component has a part 814 shaped as a louver to shade the LEDs from e.g. sunlight. The enclosure 810 is then filled with the chosen potting material 815. The enclosure 810 and the potting material 815 form a potted island.

The enclosure 810 is preferably positioned as indicated on FIGS. 8*b*, 8*c*, 8*e*, 8*f* and 9 so that its length L (i.e. its longest dimension within the plane of the tile) is aligned with the direction D1 that will experience the least bending or in other words the principal direction along which the radius of curvature of the tile at the position of the diodes will be larger than the radius of curvature of the tile in other directions. For instance, for the flexible display 900 of FIGS. 9*a*, 9*b* and 9*c*, the smallest radius of curvature is expected in the direction D2 and the largest radius of curvature is expected in the direction D1 which in this case is perpendicular to D2. The enclosure 810 is thus preferably positioned on the tile such that its longer dimension L is aligned with the principal direction D1.

The flexible display 900 of FIG. 9 is meant to hang vertically from a support. D2 is the direction parallel to the longest dimension of the flexible display 900 when it is fully extended. The flexible display 900 can be rolled (e.g. for storage or transport purposes) around an axis A parallel to D1 as illustrated on FIG. 9. If the potting material had been spread without interruption over the entire tile, the potted layer would have experience more stress than is the case with the present invention where the potting is done locally (i.e. limited to e.g. two diodes at a time) and the rolled display would tend to unroll.

Figure 8D:
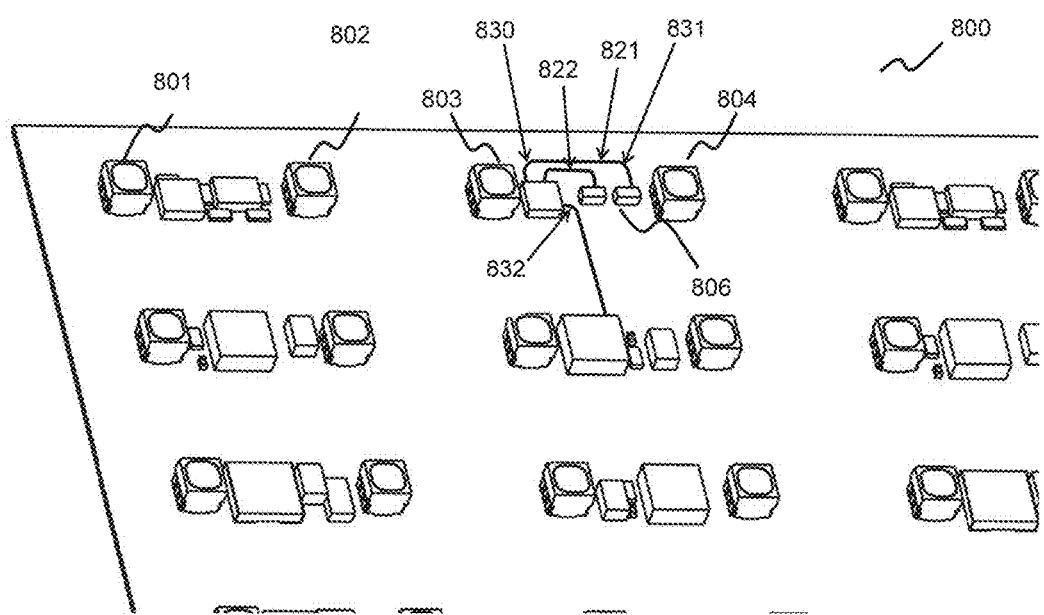
Figure 8E:
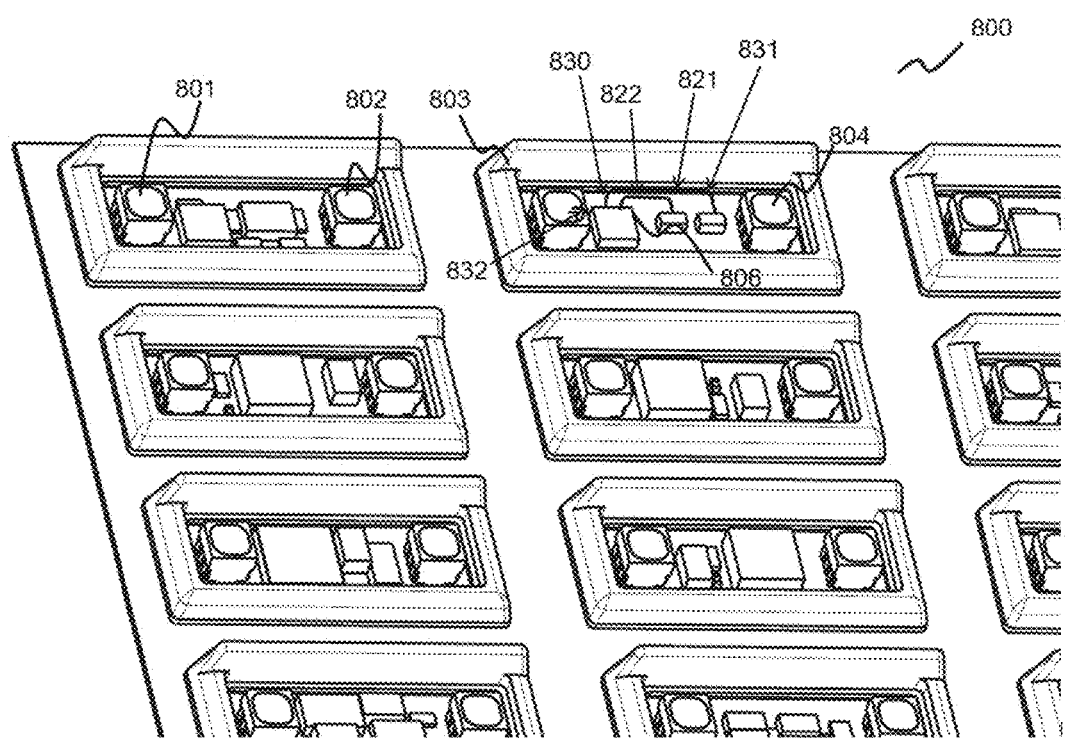

The LEDs and electronic components may be linked by electrically conducting tracks, some of which are shown on FIG. 8*d*. The tracks may have rectilinear portions 820, 821 and 822. The tracks may also have corners 830, 831, 832. As described in "Rigid-Flex PCB Design: a Guide Book for Designers" by Ben Jordan, it is generally best to avoid abrupt hard right-angle trackwork, and even better than using 45° hard corners, route the tracks with arc corner modes. In order to mitigate this limitation and reduce the stress induced by bending of the display, the corners are preferably located within the potted region of the flexible display. For instance, as shown on FIG. 8*e*, the corners 830, 831 and 832 are located right under or within the enclosure 810.

Potted islands can be limited to two LEDs like e.g. the potted islands 901, 902, 903 and 904 on FIG. 9*a*. Potted island can also extend over more than two LEDs. For instance, for the flexible display 900 of FIG. 9*a*, potted islands like 905 can extend from one side of the flexible display to the other in a direction parallel to D1. If the flexible display is tiled, the potted island 905 extends from one side of a tile to the other. As long as the potted islands do not extend too much laterally (i.e. in the direction D2 in the example of FIG. 9*a*) the potting will not substantially decrease the flexibility of the flexible display 900.

The local potting also allows to introduce a new parameter on which to play when realizing a flexible tiled display according to the present invention. Indeed, the power, ground and data and instruction signals being accessible on more than one bus under a tile 800, it is possible to cut a tile 800 along a line parallel to the power, ground, data and command signals. The dimensions of a tile can thus be modified after the tile has been fully assembled. This increases the number of ways assembled tiles and carrier substrates can be combined to assemble a flexible tiled displays of desired dimensions starting from tiles and carrier substrate of given dimensions.

Figure 10:
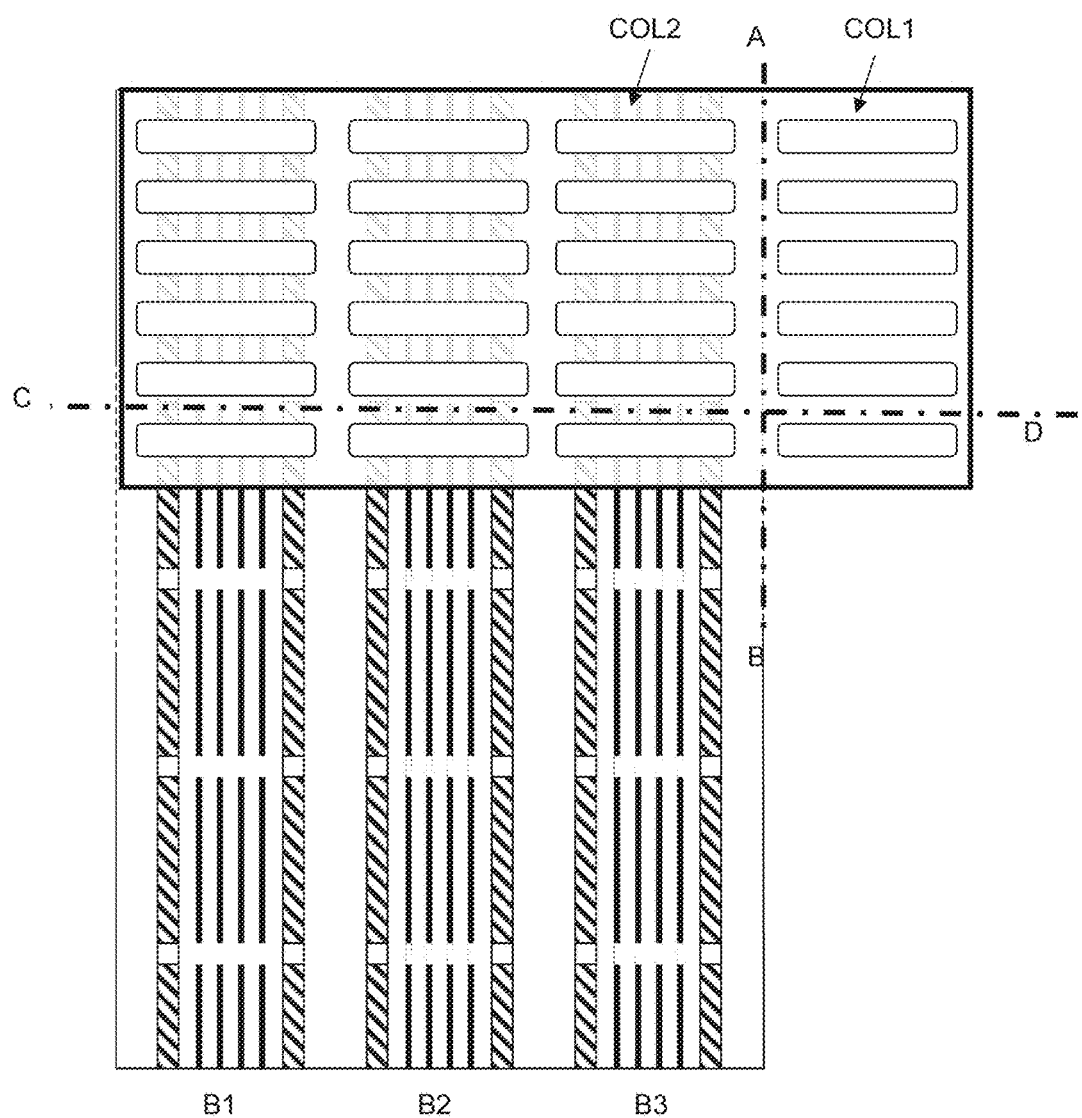
FIG. 10 provides an example of potting interrupted at regular intervals.

It is therefore advantageous to interrupt the potting at regular interval as described above. An example of this is given on FIG. 10. On request of a customer, a technician is sent on short notice at said customer's with a roll of carrier substrate with width 3 W and comprising three buses in parallel (B1, B2, B3) to distribute power, ground and data and command signals as seen on FIG. 10*a*. The available tiles have a width 4 W. Upon arrival of the technician, the customer requests a display of width 3 W over a length of e.g. 20 W. The display must be able to operate when exposed to the elements (in particular rain and sun). To do so without the benefit of the present invention, the technician would need a tailor made tile of width 3 W that has been potted to be water proof and with shaders to prevent decrease of the contrast when sunlit. The technician is therefore unable to satisfy the request of the customer.

With the present invention, the technician will merely have to cut the tile along the dotted line AB between two columns COL1 and COL2 of potted islands. This is made easy by the absence of potting material between the two columns of potted islands. Assembly of the flexible display can then proceed as detailed previously.

The same advantage exists if a tile must be cut along a line CD parallel to the length of the enclosures.

Indeed, if the tiles have a length 6 W, the realization of a display of length 20 W is possible by assembling 3 tiles of length 6 W and cutting one tile in order to obtain a tile that is 2 W long and 3 W wide.

Figure 11:
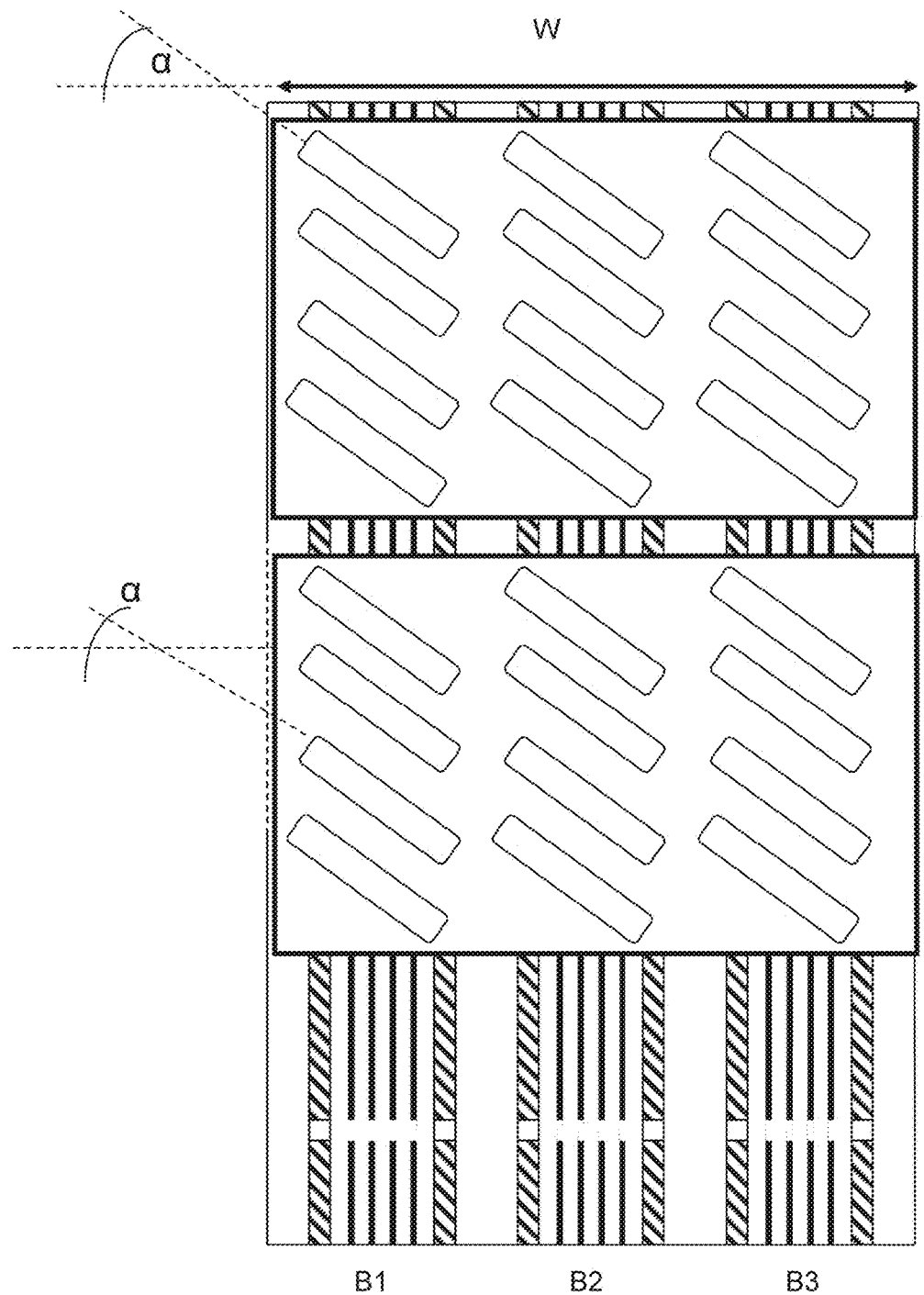
FIG. 11 illustrates a non-planar tiled display according to an embodiment of the present invention, in which the length L of the potting islands is at an angle with the width of the carrier substrate.

When the flexible display is destined to form non-planar tiled display (non-planar in normal operation), local potting can be used to determine directions along which the curvature will be maximum and the directions along which the curvature will be minimum once the display is unrolled. For instance, the length L of the potting islands can be at an angle with the width of the carrier substrate as shown on FIG. 11.

Figure 12:
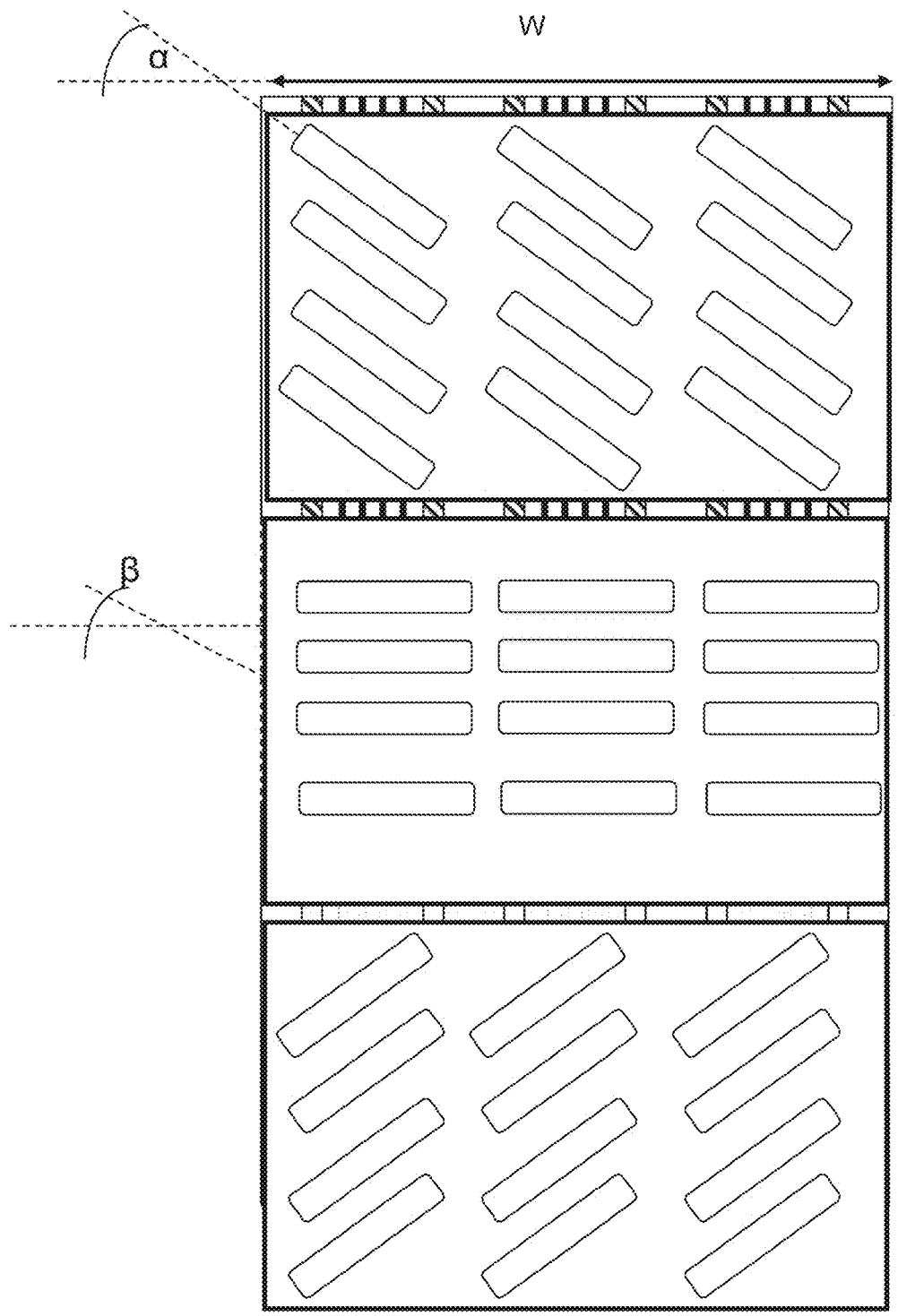
FIG. 12 illustrates a non-planar tiled display according to an embodiment of the present invention, in which the angle between the length L of the potting islands and the width of the carrier substrate varies from one region of the display to the other.
Figure 13:
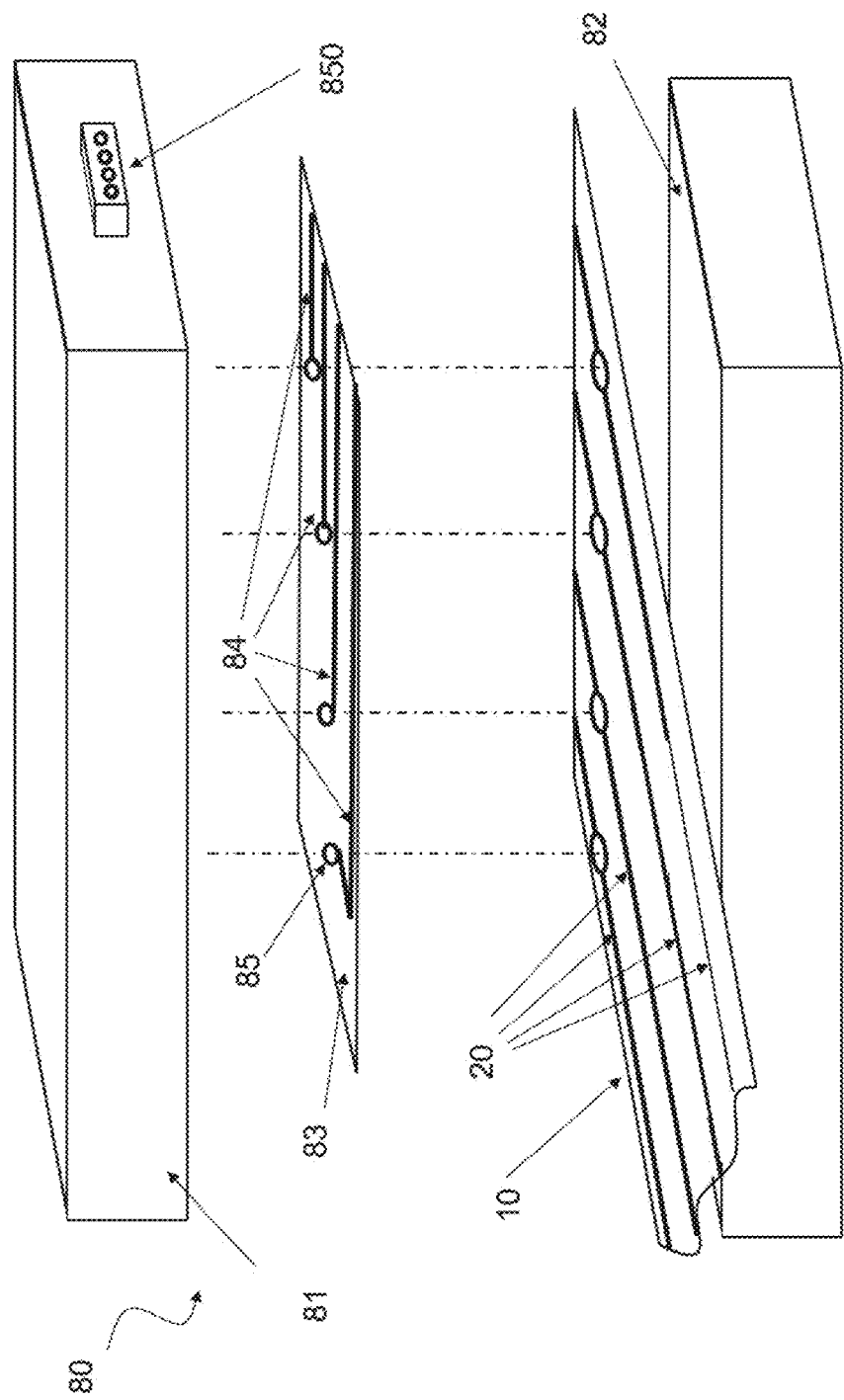
FIG. 13 illustrates a circuit with at least one set of tracks inserted between an upper and a lower beam according to an embodiment of the present invention.
Figure 14:
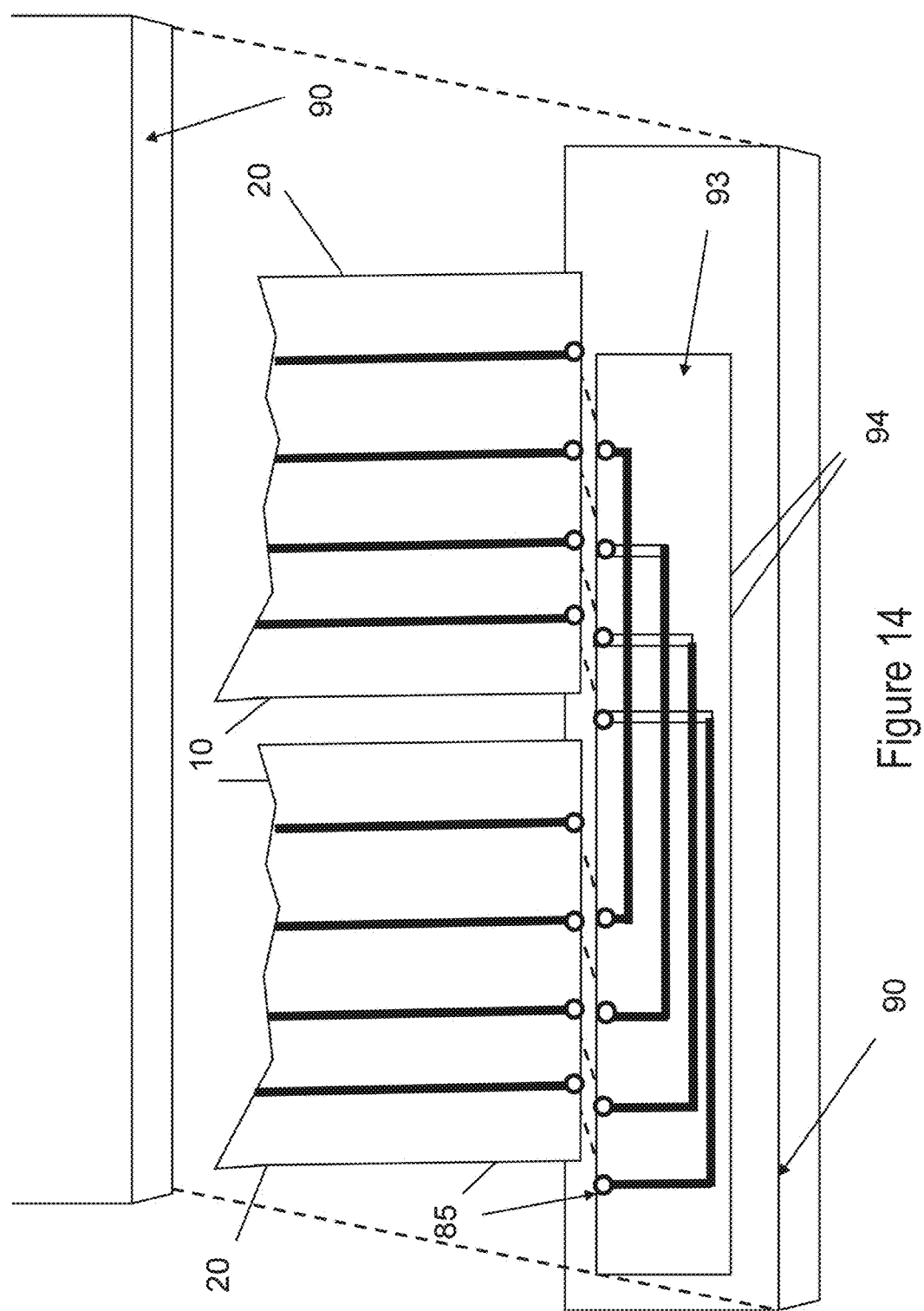
FIG. 14 illustrates a second clamp connector which can used at the second end of the carriers according to an embodiment of the present invention.
Figure 15:
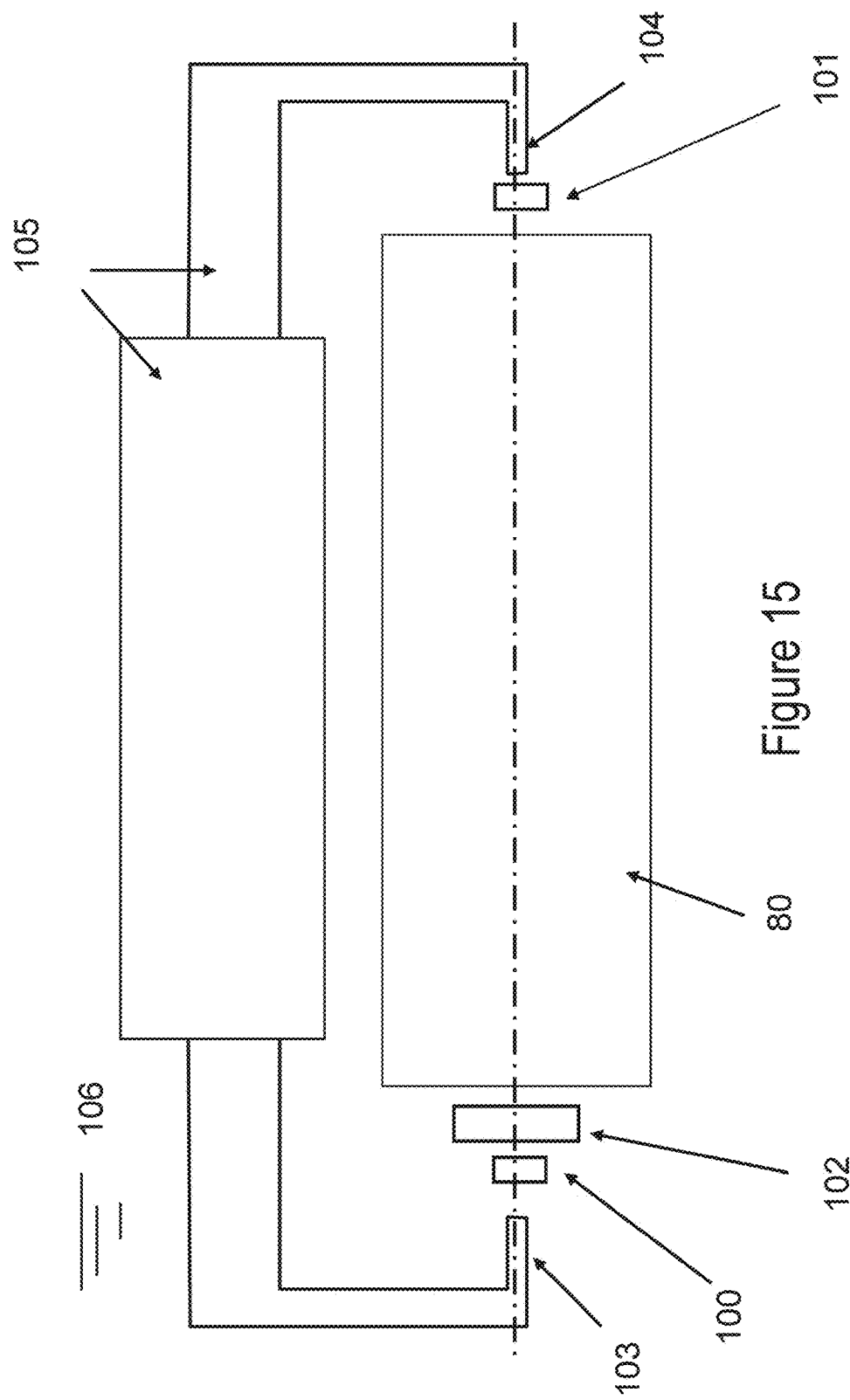
FIG. 15 illustrates a left side view of a clamp connector equipped with ball bearings and a toothed wheel according to an embodiment of the present invention.
Figure 16:
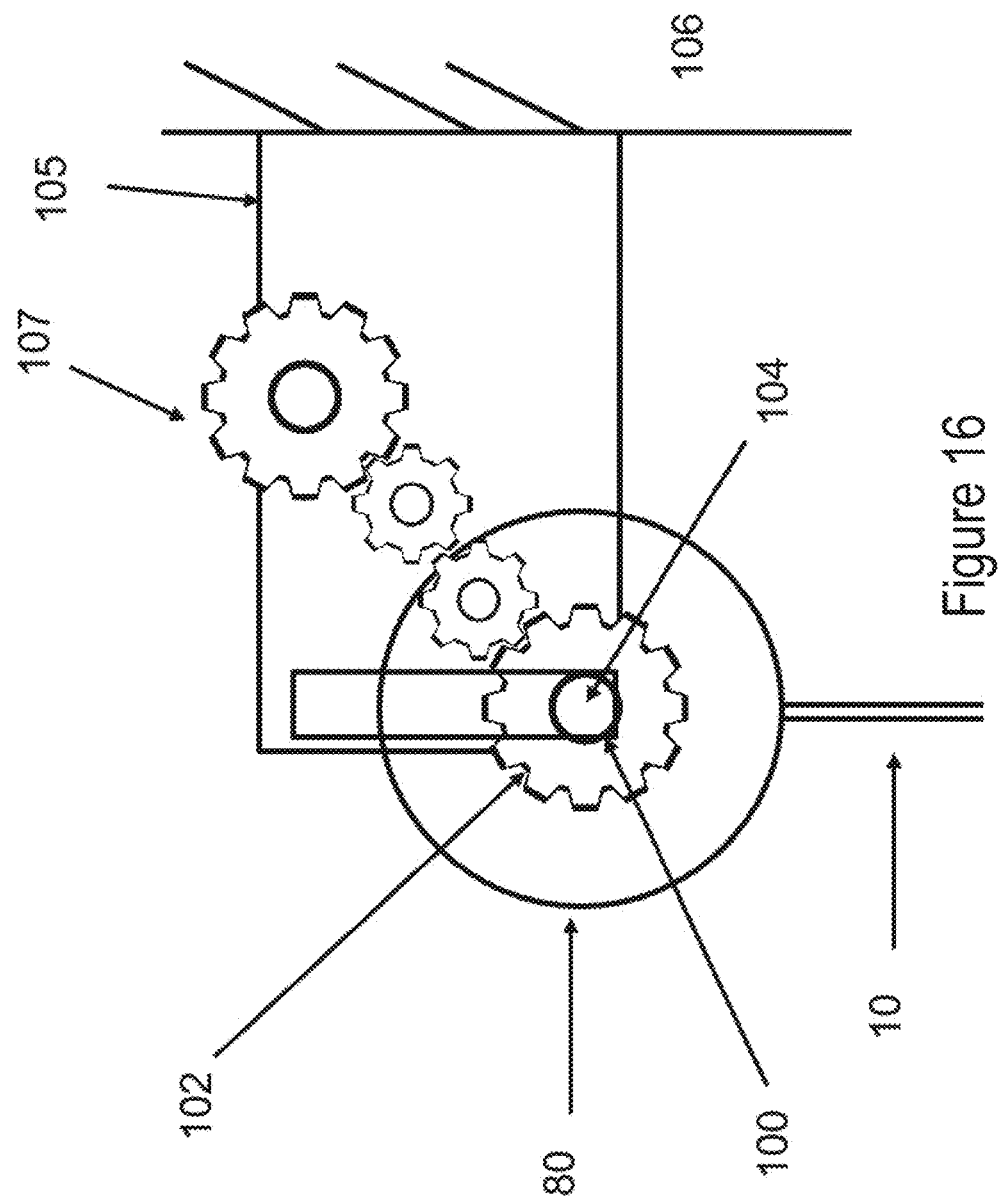
FIG. 16 illustrates a right side view of the clamp connector of FIG. 15.

The angle between the length L of the potting islands and the width of the carrier substrate can vary from one region of the display to the other (or in other words, the length of a first potting island and the length of a second potting island are not necessarily parallel) as shown on FIG. 12.

The thicker the potting, the less flexible will be the resulting display. By varying the thickness of the potting from one region of the tiled display to another, one will also influence the shape that the flexible display will take when it is deployed.

While the application of potting around groups of luminous sources has been described hereinabove in conjunction with a tiled display comprising discrete luminous sources distributed over at least two adjacent flexible display tiles, the skilled person will appreciate that this principle has more general application without loss of the associated technical effects and advantages. In particular, it is advantageous to provide enclosures with a length L and a width l around groups of luminous sources (e.g., diodes) on a flexible carrier, the number of luminous sources being less than the number of luminous sources on that carrier, the enclosures to be filled with a potting material.

While the invention has been described hereinabove with reference to a number of embodiments, this is done to illustrate and not to limit the invention, the scope of which is determined by the accompanying claims. The skilled person will appreciate that features disclosed herein in connection with individual embodiments may be combined with features from other embodiments to obtain the same technical effects and advantages, without departing from the scope of the invention.

The invention claimed is:

1. A method of producing a flexible display tile, the method comprising:
    providing a plurality of luminous sources on a flexible substrate;
    arranging each one of a plurality of elongate enclosures around one or more of said luminous sources with a longest side of the elongate enclosures aligned in a common direction of the flexible display tile, wherein the plurality of elongate enclosures is arranged in rows and columns; and
    filling each elongate enclosure of the plurality of elongate enclosures with a potting material such that the elongate enclosure and the potting material form a potted island, such that the potted islands are arranged in rows and columns, with lines between the rows and columns of the potted islands determining the lines along which a user can cut the flexible display tile to a smaller flexible display tile, the flexible display tile being such that the power, ground and data and instructions signals are provided to the flexible display tile by more than one bus under said flexible display tile.

2. A flexible display tile produced according to the method of claim 1.

3. The flexible display tile according to claim 2, wherein a portion of the elongate enclosures is arranged so as to provide shading to the luminous sources within the elongate enclosure.

4. The flexible display tile according to claim 2, arranged in a rolled up configuration, such that said common direction is aligned with an axis around which the display tile is rolled up.

5. The flexible display tile according to claim 2, wherein the display tile comprises at least one conductive track, wherein at least one corner in said at least one conductive track is covered by said potting material.

6. A method of using the flexible display tile according to claim 2 in a display system comprising the step of bending said flexible display tile such that the common direction corresponds to a smallest curvature of the flexible display tile.

7. The flexible display tile according to claim 3, arranged in a rolled up configuration, such that said common direction is aligned with an axis around which the display tile is rolled up.

8. The flexible display tile according to claim 3, wherein the display tile comprises at least one conductive track, wherein at least one corner in said at least one conductive track is covered by said potting material.

9. The flexible display tile according to claim 4, wherein the display tile comprises at least one conductive track, wherein at least one corner in said at least one conductive track is covered by said potting material.

10. The flexible display tile according to claim 2, wherein the display tile is configured to allow separation into smaller tiles along at least one line between two of said rows and/or columns.

11. The flexible display tile according to claim 2, wherein a number of luminous sources in each elongate enclosure is less than a total number of luminous sources on the tile.

12. The flexible display tile according to claim 2, wherein the elongate enclosures delimit regions of a tile where the potting material is present and regions of a tile where no potting material is present.

13. The flexible display tile according to claim 2, wherein the potting is interrupted at regular intervals.

14. A display comprising at least two display tiles according to claim 2, wherein the tiles are addressed in parallel.

15. A display comprising at least two display tiles according to claim 2, wherein the potted island extends from one side of a tile to the other.

* * * * *